United States Patent
Ward et al.

(10) Patent No.: US 9,312,466 B2
(45) Date of Patent: Apr. 12, 2016

(54) ENERGY HARVESTER WITH IMPROVED HEAT FLOW ARRANGEMENT

(71) Applicant: Perpetua Power Source Technologies, Inc., Corvallis, OR (US)

(72) Inventors: Marcus S. Ward, Salem, OR (US); Mark J. Hauck, Corvallis, OR (US)

( * ) Notice: Subject to any disclaimer, the term of this patent is extended or adjusted under 35 U.S.C. 154(b) by 424 days.

(21) Appl. No.: 13/625,842

(22) Filed: Sep. 24, 2012

(65) Prior Publication Data
US 2013/0327370 A1    Dec. 12, 2013

Related U.S. Application Data

(63) Continuation-in-part of application No. 13/492,890, filed on Jun. 10, 2012.

(51) Int. Cl.
| | | |
|---|---|---|
| H01L 35/30 | (2006.01) | |
| H01L 35/32 | (2006.01) | |
| H01L 35/28 | (2006.01) | |
| H01L 35/00 | (2006.01) | |
| H01L 35/02 | (2006.01) | |

(52) U.S. Cl.
CPC .............. *H01L 35/32* (2013.01); *H01L 35/30* (2013.01); *H01L 35/00* (2013.01); *H01L 35/02* (2013.01); *H01L 35/28* (2013.01)

(58) Field of Classification Search
CPC ......... H01L 35/00; H01L 35/02; H01L 35/30; H01L 35/28; H01L 35/32
See application file for complete search history.

(56) References Cited

U.S. PATENT DOCUMENTS

| | | | |
|---|---|---|---|
| 6,002,081 A * | 12/1999 | Sakuragi | ...................... 136/203 |
| 6,172,486 B1 * | 1/2001 | Campagnuolo et al. | ...... 320/141 |
| 6,958,443 B2 | 10/2005 | Stark | |
| 7,629,531 B2 | 12/2009 | Stark | |
| 8,707,715 B2 * | 4/2014 | Okuda | .................... F25B 21/02 62/3.2 |
| 2005/0126184 A1 * | 6/2005 | Cauchy | ........................... 62/3.3 |
| 2009/0071526 A1 * | 3/2009 | Parker | ........................... 136/205 |
| 2010/0139291 A1 | 6/2010 | Hofmeister | |
| 2011/0094556 A1 | 4/2011 | Stark | |
| 2012/0240596 A1 * | 9/2012 | Okuda | .................... F25B 21/02 62/3.2 |

OTHER PUBLICATIONS

Perpetua Power Source Technologies, "Perpetua Flexible Thermoelectric Film", retrieved on May 25, 2012.
Perpetua Power Source Technologies, "Hows It Works," retrieved on May 25, 2012.
Marlow, "EverGen Energy Harvesters," retrieved on May 8, 2012.

\* cited by examiner

*Primary Examiner* — Allison Bourke
*Assistant Examiner* — Edward Schmiedel

(57) ABSTRACT

A thermoelectric energy harvesting system may include a thermoelectric generator that may produce a voltage in response to a temperature difference across the thermoelectric generator. The thermoelectric generator may be captured between the housing and the base member. The system may include at least one mechanical fastener coupling the housing to the base member and including a shoulder spacer formed of thermally-insulating material and positioned under the mechanical fastener.

5 Claims, 12 Drawing Sheets

ENERGY HARVESTER WITH IMPROVED HEAT FLOW ARRANGEMENT

CROSS-REFERENCE TO RELATED APPLICATIONS

The present application is a continuation-in-part of pending U.S. patent application Ser. No. 13/492,890 entitled SYSTEM AND METHOD FOR THERMAL PROTECTION OF AN ELECTRONICS MODULE OF AN ENERGY HARVESTER and filed on Jun. 10, 2012, and which claims priority to U.S. Provisional Application No. 61/520,519 filed on Jun. 10, 2011 and entitled METHOD AND APPARATUS TO THERMALLY PROTECT THE SENSITIVE ELECTRONICS IN AN ENCLOSED THERMOELECTRIC ENERGY HARVESTER, the entire contents of which each one of the above-referenced applications being expressly incorporated by reference herein.

FIELD

The present disclosure relates generally to energy harvesting systems and, more particularly, to heat flow through a thermoelectric energy harvesting system.

BACKGROUND

The trend towards miniaturization of microelectronic devices such as micro-sensors is necessitating the development of miniaturized power supplies. Batteries and solar cells are traditional power sources for such microelectronic devices. However, the power supplied by batteries dissipates over time requiring replacement of the batteries on a periodic basis. Solar cells, although having an effectively unlimited useful life, may only provide a transient source of power as the sun or other light sources may not always be available.

Thermoelectric generators are energy sources that convert thermal energy into electrical energy over an essentially unlimited lifetime. A thermoelectric generator produces a voltage in response to a thermal gradient across the thermoelectric generator. The thermal gradient may be provided by a heat source on one side of the thermoelectric generator and a lower-temperature heat sink on an opposite side of the thermoelectric generator. Heat from the heat source may flow through the thermoelectric generator prior to entering the heat sink where the heat may be rejected to the environment. The thermoelectric generator may be housed or contained within an interior of a thermoelectric energy harvesting system or module. Increasing the amount of heat flow through the thermoelectric generator and minimizing the shunting of heat flow around the thermoelectric generator may result in an increase in the operating efficiency of the thermoelectric energy harvesting system.

Certain thermoelectric energy harvesting systems may include electronic components to condition the voltage produced by the thermoelectric generator prior to delivery to a load. Electronic components may also be provided to perform application-specific functions. Electronic components typically have a maximum rated temperature up to which the electronic components may operate on a nominal basis. Approaching the maximum rated temperature of the electronic components may result in a reduction in the performance of the electronic components. Exceeding the maximum rated temperature of the electronic components may result in damage or failure of the electronic components. A failure of the electronic components may compromise the electricity-producing capability of the thermoelectric generator.

As can be seen, there exists a need in the art for a system and method of minimizing the heating of electronic components that may be included in a thermoelectric energy harvesting system. In addition, there exists a need in the art for increasing the heat flow through the thermoelectric generator and for minimizing the shunting of heat flow around the thermoelectric generator as a means to improve the operating efficiency of the thermoelectric energy harvesting system.

SUMMARY

The above-noted needs associated with electronic components in energy harvesting systems are specifically addressed and alleviated by the present disclosure which provides a thermoelectric energy harvesting system having a thermoelectric generator and an electronics module. The thermoelectric generator may produce a voltage in response to a temperature difference across the thermoelectric generator which generates useful power across an electrically-connected external load. The system may include a housing mounted on top of the thermoelectric generator. The housing may include a cavity containing the electronics module. The electronics module may condition the power output of the thermoelectric generator and/or perform application-specific functions. The cavity may be enclosed by one or more inner surfaces of the housing. The system may include a radiation shield covering at least a portion of one or more of the inner surfaces. The radiation shield may prevent or reduce radiative heating of the cavity from the heat in the housing.

In a further embodiment, disclosed is a thermoelectric energy harvesting system having a thermoelectric generator producing a voltage in response to a temperature difference across the thermoelectric generator. The system may further include a housing having a cavity defined by a housing bottom upper surface and a housing side wall inner surface. The system may include a heat sink mounted on top of the housing and enclosing the cavity and having a heat sink lower surface. A radiation shield may be mounted to the housing bottom upper surface and the housing side wall inner surface for blocking or minimizing radiative heating of the cavity.

The system may include a compliant thermally-insulative layer mounted to the radiation shield. An electronics module may be mounted within the cavity on top of the compliant thermally-insulative layer. The electronics module may be configured to regulate the voltage produced by the thermoelectric generator. The electronics module may have an upper surface and a lower surface. The system may include a compliant thermal transfer pad interposed between the heat sink lower surface and the electronics module upper surface for thermal coupling therebetween. The system may additionally include a compliant thermally-conductive layer extending between the electronics module lower surface and the heat sink and forming a heat conduction path therebetween.

In a further embodiment, disclosed is a method of minimizing the heating of an electronics module in a thermoelectric energy harvesting system. The method may include the step of providing a temperature difference across a thermoelectric generator such that the thermoelectric generator produces a voltage. The method may include providing a housing mounted on top of the thermoelectric generator. The housing may have a cavity containing an electronics module. The housing may have heat flowing along a system heat path in response to the temperature difference across the thermoelectric generator. The method may further include the step of blocking radiative heat flow into the cavity using a radiation shield.

In an embodiment, disclosed is a thermoelectric energy harvesting system that may include a thermoelectric generator for producing a voltage in response to a temperature difference across the thermoelectric generator and which may generate power when coupled to a load. The thermoelectric generator may be captured between the base member and the housing. The thermoelectric energy harvesting system may include at least one mechanical fastener coupling the housing to the base member and may include a shoulder spacer formed of thermally-insulating material and positioned underneath and/or around the mechanical fastener.

In further embodiment, disclosed is a thermoelectric energy harvesting system that may include a housing mounted on top of the thermoelectric generator. The housing may include a cavity for containing an electronics module. The thermoelectric energy harvesting system may include a base member that may be positioned under the housing in a manner such that the thermoelectric generator is mounted between the base member and the housing. The base member may have a hollow region formed in an underside of the base member. The hollow region may include a hollow region upper surface. The base member may include a magnet having a magnet upper surface and which may be contained within the hollow region. The magnet may facilitate magnetic attachment of the thermoelectric energy harvesting system to a ferromagnetic heat source. A magnetically-attracted plate may be mounted on top of the magnet between the hollow region upper surface and the magnet upper surface. The magnetically-attracted plate may be sized and configured to close magnetic field lines of the magnet to strengthen the magnetic attraction between the magnet and the ferromagnetic heat source.

In a further embodiment, disclosed is an thermoelectric energy harvesting system that may include an insulating ring that may extend around a circumference of the housing and the base member. The insulating ring may have a ring inner circumferential surface. One or more annular grooves may be formed in at least one of the housing and the base member face. The annular groove may face the ring inner circumferential surface. An insulating ring adhesive may at least partially fills the one or more annular grooves and may adhesively bond the insulating ring to the housing and/or the base member.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein.

DETAILED DESCRIPTION

Figure 1:
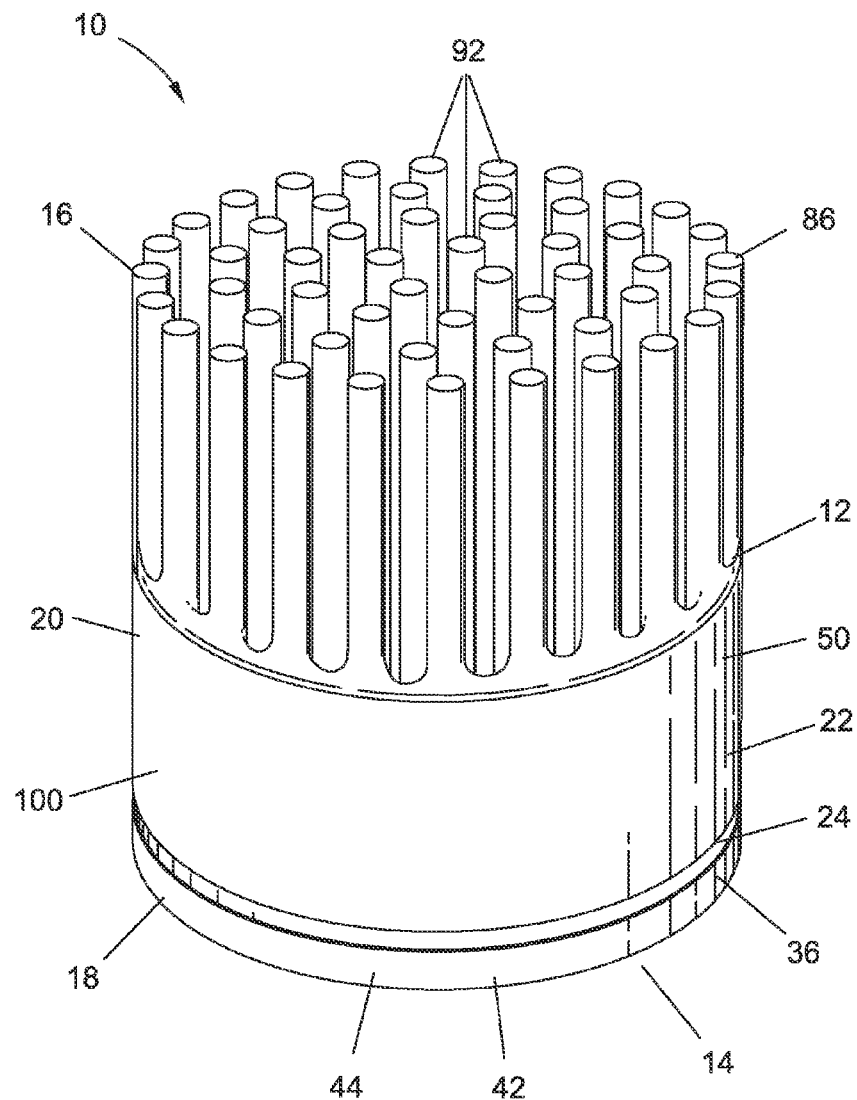
FIG. 1 is a perspective view of a thermoelectric energy harvesting system containing a thermoelectric generator and an electronics module.

Referring now to the drawings wherein the showings are for purposes of illustrating various embodiments of the present disclosure, shown in FIG. 1 is a perspective view of an embodiment of a thermoelectric energy harvesting system 10. The system 10 may contain an energy harvester 22 such as a thermoelectric generator 24. The system 10 may additionally include an electronics module 100 and a battery 118. In an embodiment, the system 10 may be configured as a field-deployable unit having the electronics module 100 and the thermoelectric generator 24 integrated into the system 10.

In an embodiment, the electronics module 100 and the battery 118 may be contained within a housing 50 of the system 10. For example, the electronics module 100 and the battery 118 may be contained within a cavity (not shown) formed in the housing 50 for protecting the electronics module 100 from exposure to moisture, mechanical impact, and excessive heat. In this regard, the housing 50 may be configured to minimize thermal stress on the electronics module 100 and the battery 118. Such thermal stress may compromise the functionality or operability of heat-sensitive components such as capacitors (not shown) and/or batteries. For example, excessive heating of capacitors may reduce the capability of the capacitors to hold a charge.

The system 10 may have a system side 20, a system upper end 16, and a system lower end 18. The system 10 may include a base member 36 at the system lower end 18. The base member 36 may be mounted to a heat source 84. The thermoelectric generator 24 may be mounted on top of the base member 36. The thermoelectric generator 24 may be environmentally sealed between the housing bottom 58, the base member 36, and an insulating ring 44. The insulating ring 44 may be adhesively bonded to the base member 36 and to the housing 50 to mechanically stabilize the energy harvesting system 10 and to seal the thermoelectric generator 24 from exposure to moisture and protection from mechanical impact and other environmental effects. The thermoelectric generator 24 may produce a voltage in response to a temperature difference across the thermoelectric generator 24. The system 10 may include a heat sink 86 at the system upper end 16. The heat sink 86 may be mounted on top of the housing 50. Heat may flow along a system heat path 94 from the heat source 84 through the thermoelectric generator 24 and into the housing 50 whereupon the heat may enter the heat sink 86 for discharge into the environment by radiative heat transfer, natural convective heat transfer, or conductive heat flow from forced airflow between the cooling elements 92 and the ambient air as described in greater detail below. Although shown as having a generally cylindrical configuration, the system 10 may be provided in any size, shape, and configuration, without limitation.

Figure 2:
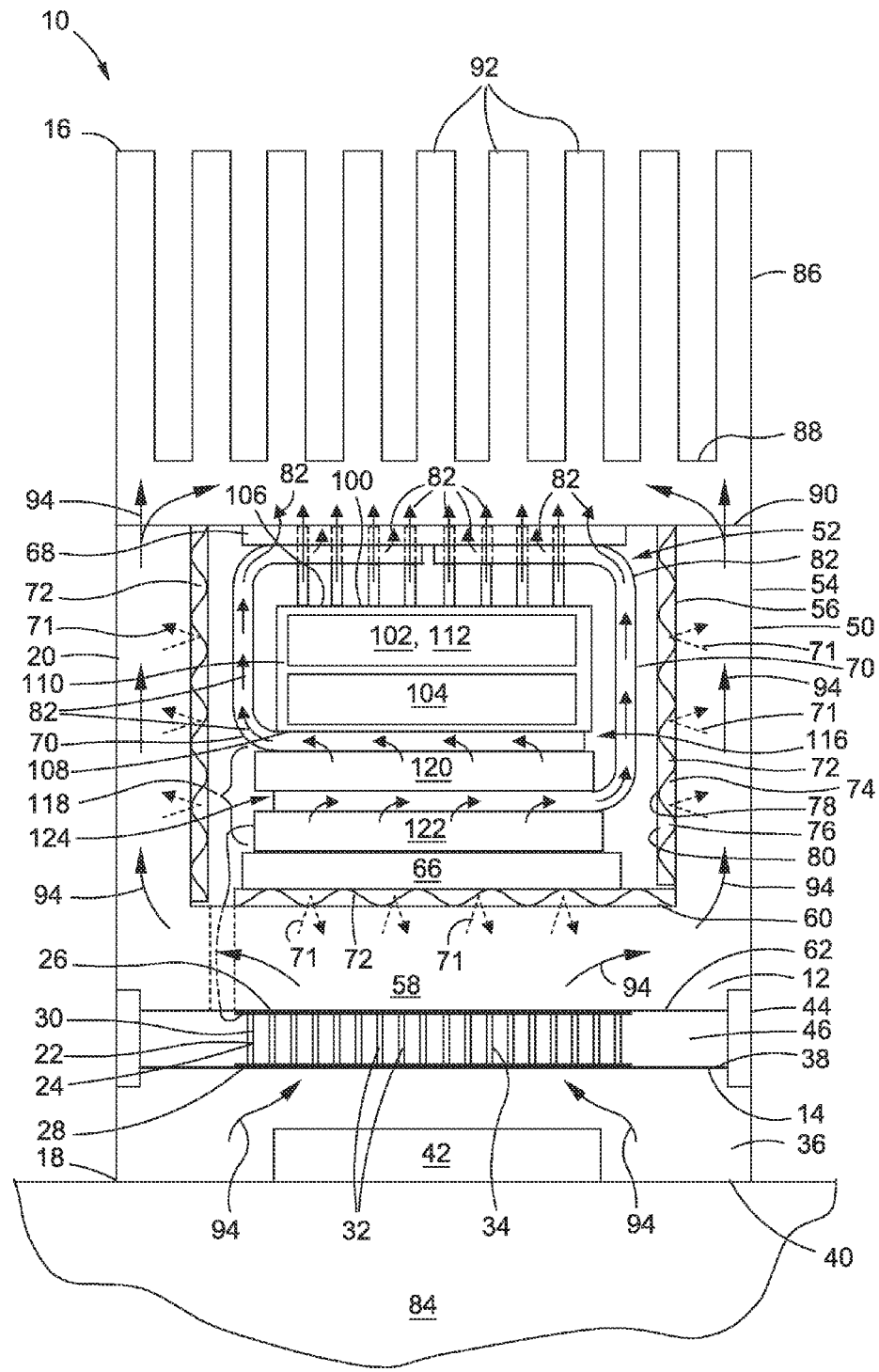
FIG. 2 is a side sectional view of an embodiment of a thermoelectric energy harvesting system having a radiation shield mounted along an inner surface of a cavity containing the electronics module and a battery.

Referring to FIG. 2, shown is a cross-sectional view of an embodiment of the thermoelectric energy harvesting system 10. The system 10 may include the base member 36 which may be configured for mounting to a heat source 84. The base member 36 may be formed of any suitable material for thermal conduction of heat from the heat source 84 into the thermoelectric generator 24. For example, the base member 36 may be formed of metallic material including, but not limited to, aluminum. The base member 36 may include a base member upper surface 38 and a base member lower surface 40. The base member lower surface 40 may be configured for mounting to a surface of a heat source 84.

In an embodiment, the base member 36 may include one or more magnets 42 which may be mounted or contained within the base member 36 to facilitate attachment of the system 10 to a heat source 84 formed at least partially of ferromagnetic material. In this regard, the magnet 42 may provide magnetic-mounting capability for industrial applications. For example, the magnet 42 may facilitate mounting of the system 10 to a motor, a bearing housing, a heated pipe, or any other system, subsystem, assembly, or structure that may provide a heat source 84 for the thermoelectric generator 24. However, the system 10 may include alternative means for attaching the base member 36 to a heat source 84 and is not limited to magnetic mounting. For example, the system 10 may include one or more mechanical features (not shown) for mechanically coupling the system 10 to a heat source 84.

The system 10 may include a thermoelectric generator 24 that may be coupled to the base member 36. For example, the thermoelectric generator 24 may be mounted on top of the base member 36. The thermoelectric generator 24 may include a thermoelectric generator upper surface 26 and a thermoelectric generator lower surface 28 which may comprise upper and lower heat couple plates (not shown) for the thermoelectric generator 24. The thermoelectric generator 24 may be positioned between the base member 36 and the housing 50. In an embodiment, the thermoelectric generator lower surface 28 may be mounted in contacting relation to the base member upper surface 38. The thermoelectric generator upper surface 26 may be mounted in contacting relation to a housing bottom lower surface 62. Thermal interface material (not shown) comprising highly-thermally conductive adhesive, grease, paste, epoxy, or other highly-thermally conductive material may be included between the thermoelectric generator lower surface 28 and the base member upper surface 38 and between the thermoelectric generator upper surface 26 and the housing bottom lower surface 62 to prevent or minimize air gaps or voids between the thermoelectric generator upper and lower surface 26, 28 and the base member upper surface 38 and the housing bottom lower surface 62 to reduce thermal resistance therebetween. The thermoelectric generator 24 may be configured to produce a voltage in response to a temperature difference across a hot side 14 and a cold side 12 of the thermoelectric generator 24.

The thermoelectric generator 24 may be configured in an in-plane configuration or in a cross-plane configuration. In an embodiment of an in-plane configuration, the thermoelectric generator 24 may be formed of a thin semiconductor film or substrate arranged in a coiled or spiral configuration and having a plurality of thermocouples similar to the arrangement disclosed in U.S. Pat. No. 7,629,531 entitled IMPROVED LOW POWER THERMOELECTRIC GENERATOR and issued on Dec. 8, 2009 to Stark, the entire contents of which is incorporated by reference herein. In another embodiment of an in-plane configuration, the thermoelectric generator 24 may be formed of a plurality of semiconductor films or substrates arranged in a stacked formation similar to the arrangement disclosed in U.S. Pat. No. 6,958,443 entitled LOW POWER THERMOELECTRIC GENERATOR and issued on Oct. 25, 2005 to Stark et al., the entire contents of which is incorporated by reference herein. In a further embodiment, the thermoelectric generator 24 may be configured as a planar thermoelectric generator (not shown) similar to the arrangement disclosed in U.S. Patent Publication No. 2011/0094556 entitled PLANAR THERMOELECTRIC GENERATOR and published on Apr. 28, 2011 to Stark, the entire contents of which is incorporated by reference herein. However, the thermoelectric generator 24 may be provided in any one of a variety of sizes, shapes, and configurations, without limitation, and is not limited to an in-plane configuration.

In FIG. 2, shown is an embodiment of the system 10 implementing one type of cross-plane thermoelectric generator 24. The system 10 may include the housing 50 that may be thermally coupled to the thermoelectric generator upper surface 26 as indicated above. As indicated above, the housing 50 may be mechanically coupled to the base member 36 by means of an insulating ring 44 that may extend around a circumference of the housing 50 and the base member 36. The insulating ring 44 may be formed of material having a relatively low thermal conductivity such that a substantial majority of heat from the heat source 84 flows into the base member 36 and through the thermoelectric generator 24 from the thermoelectric generator lower surface 28 to the thermoelectric generator upper surface 26 and into the housing 50. In the embodiment shown, the thermoelectric generator 24 may be sized and configured such that an annular gap 46 is defined between the thermoelectric generator sides 30 and the insulating ring 44. The annular gap 46 may minimize the heat transfer from the base member 36 to the housing 50.

The housing 50 may include the housing side wall 54 and the housing bottom 58. The housing bottom 58 may include a housing bottom upper surface 60 and a housing bottom lower surface 62. The housing bottom lower surface 62 may be in contact with the thermoelectric generator upper surface 26 as indicated above. The housing side wall 54 may include a housing side wall inner surface 56. The housing bottom upper surface 60 and the housing side wall inner surface 56 may define the cavity 52 of the housing 50. The housing 50 may be formed of a relatively highly thermally conductive material such as a metallic material. For example, the housing 50 may be formed of aluminum or other thermally conductive material.

Figure 3:
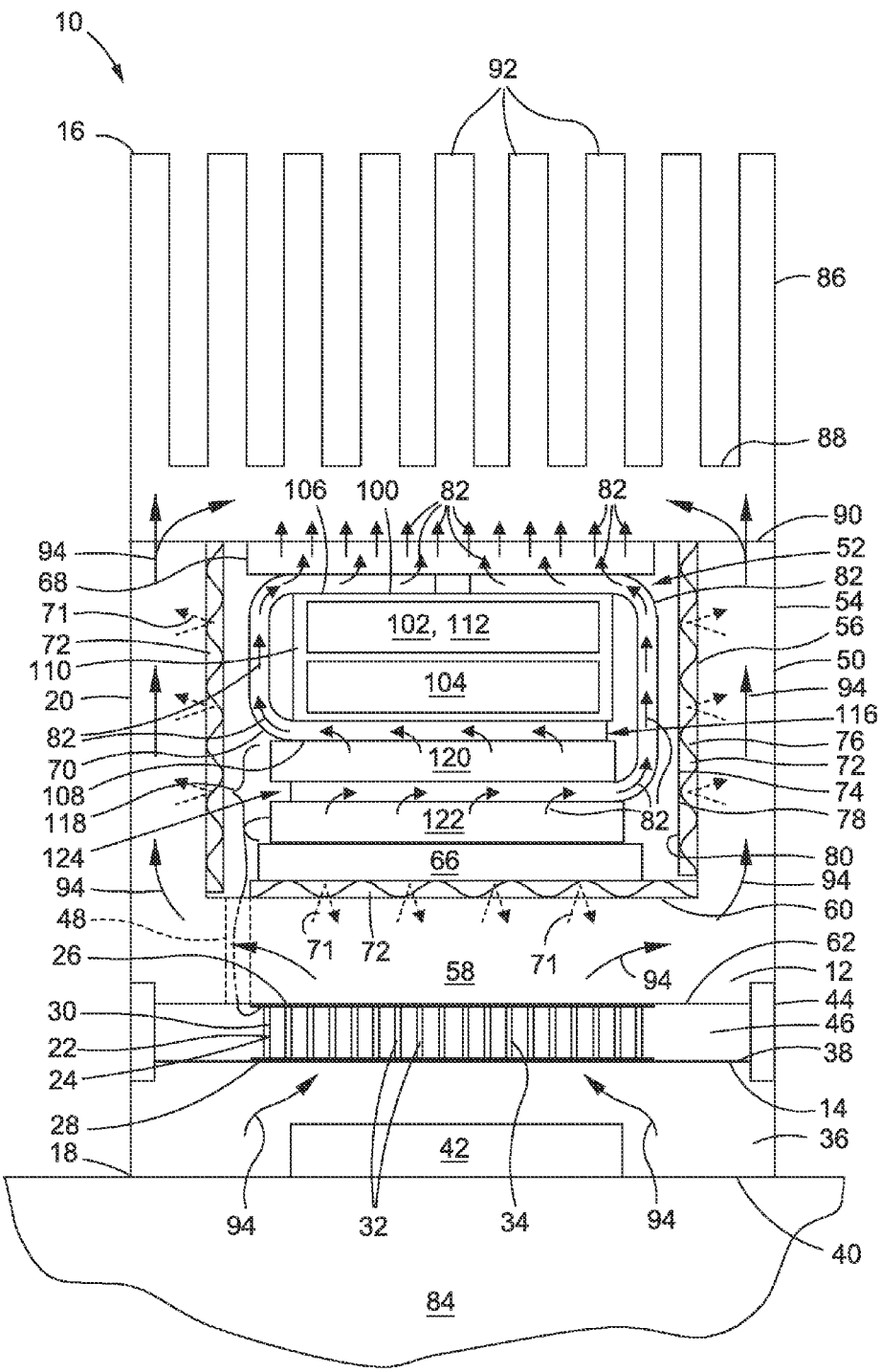
FIG. 3 is a side sectional view of a further embodiment of a thermoelectric energy harvesting system having heat conducting pins extending from the electronics module toward the heat sink.

The system 10 may further include a heat sink 86 that may be mounted on top of the housing 50. The heat sink 86 may have a heat sink upper surface 88 and a heat sink lower surface 90. The heat sink upper surface 88 may include a plurality of cooling elements 92 for facilitating heat exchange with the environment. For example, the heat sink 86 may include a plurality of cooling fins or cooling pins extending upwardly from the heat sink 86 for radiative heat transfer and/or natural convective heat transfer into the ambient air of the surrounding environment or heat conduction via forced airflow. Although the cooling elements 92 are illustrated in FIG. 2-3 as generally parallel cooling pins protruding straight upwardly, the cooling pins may be splayed outwardly to provide increased distance between the cooling pins and to increase the heat-exchanging volume of the heat sink 86 which may improve the heat-rejecting capability of the heat sink 86. The base member 36, the housing 50, and the heat sink 86 may define a system heat path 94 along which heat may flow from the heat source 84 into the base member 36 and through the thermoelectric generator 24 and up through the housing 50 and into the heat sink 86. The electronics module 100 may be sized and configured such that the electronics module sides 110 are disposed in non-contacting relation to the inner surface of the housing 50 to minimize conductive heat transfer into the electronics module 100.

The heat sink lower surface 90, the housing side wall inner surface 56, and the housing bottom upper surface 60 may collectively enclose the cavity 52. The cavity 52 may contain one or more electronics modules 100. In the embodiment shown, the electronics module 100 may be communicatively coupled to the thermoelectric generator 24 by means of electrical wiring 48 such as a power line passing through an aperture 64 or hole that may be formed in the housing bottom 58. In an embodiment, the electronics module 100 may include power management electronics 102 for managing or conditioning the power provided by the thermoelectric generator 24. The conditioning of the power provided by the thermoelectric generator 24 may include voltage rectification, voltage stabilization, providing protection against excessively high voltage or excessively low voltage, boosting the voltage produced by the thermoelectric generator 24, power matching, energy storage, and other power conditioning operations.

In an embodiment, the power management electronics 102 may be specifically configured to regulate the voltage produced by the thermoelectric generator 24. For example, power management electronics 102 may provide voltage within a predetermined voltage range to a load such as a wireless sensor. In an embodiment, the electronics module 100 may include a battery 118, a capacitor, or a super capacitor for storing electricity generated by the thermoelectric generator 24. The battery 118 may include a battery element 120 for storing power and/or a battery circuit board 122 for managing electrical energy stored by the battery element 120. The battery circuit board 122 may also mechanically support the battery element 120.

In a further embodiment, the electronics module 100 may additionally include an application-specific module 104. For example, an application-specific module 104 may be provided for any one of a variety of different applications including, but not limited to, remote sensing, data logging/recording/storage, signal processing, computational resources, wireless communication circuitry, or other applications. In an embodiment, the application-specific module 104 may be configured similar to the arrangement disclosed in U.S. Pat. No. 8,198,527 B2, issued to Hofmeister et al. on Jun. 12, 2012 and entitled FIELD-DEPLOYABLE ELECTRONICS PLATFORM HAVING THERMOELECTRIC POWER SOURCE AND ELECTRONICS MODULE, the entire contents of which is incorporated by reference herein. In an embodiment, the system 10 disclosed herein may be configured in a radio frequency identification (RFID) embodiment to facilitate recordation and/or storage of sensor data using the power supplied by the internal thermoelectric generator 24 with data extraction performed by power supplied by an external RF source (not shown). However, the system 10 disclosed herein may be configured for implementation in any one of a variety of different applications and is not limited to an RFID embodiment for remote sensing.

Referring still to FIG. 2, the system 10 may advantageously include a radiation shield 72 mounted along one or more of the inner surfaces of the cavity 52 to minimize radiative heating 71 of the electronics module 100. In the embodiment shown, the radiation shield 72 may be installed or mounted on the housing bottom upper surface 60 and/or on the housing side wall inner surface 56. The radiation shield 72 may be mounted to the housing side wall inner surface 56 and may extend around an inner circumference of the housing side wall 54. Likewise, a radiation shield 72 may be mounted to a substantial portion of the housing bottom upper surface 60. The radiation shield 72 may be specifically configured to block, prevent, reduce, minimize, or otherwise eliminate radiative heating 71 of the cavity 52 that may otherwise occur in response to the heat flowing through the housing 50 along the system heat path 94. The radiation shield 72 may retard or reduce radiative heat transfer into the cavity 52 which may otherwise cause heating of the electronics module 100.

The radiation shield 72 may be formed of a core 74 material such as a sheet or layer of foam, paper, aramid, or other material having a relatively low thermal conductivity. The core 74 may include a low-emissivity coating 78 applied to at least one side of the core 74. For example, the core 74 may include a low-emissivity metallic 80 coating such as an aluminum coating that may be applied to at least one side of the core 74 or to both sides of the core 74. In an embodiment, the core 74 may be provided in a corrugated configuration 76 having opposing face sheets (not shown) mounted to opposing sides of the corrugated core 76. A low-emissivity coating 78 such as a metallic 80 coating (e.g., aluminum) may be applied to one or both of the opposing face sheets. Advantageously, in any of the embodiments disclosed herein, the radiation shield 72 may be configured to function as a thermally reflective layer to reflect heat within the housing 50. In this manner, the radiation shield 72 may significantly reduce radiative heating 71 of the cavity 52 which may otherwise add to the heating of the electronics module 100.

The system 10 may further include a compliant thermally-insulative layer 66 that may be mounted within the cavity 52. For example, a compliant thermally-insulative layer 66 may be mounted on top of the radiation shield 72 of the housing bottom 58. The electronics module 100 may be mounted on top of the compliant thermally-insulative layer 66. The compliant thermally-insulative layer 66 may be compliant in the sense that the compliant thermally-insulative layer 66 may mechanically comply or conform to the surface contours of the electronics module lower surface 108 and/or the housing bottom upper surface 60. In addition, the compliant thermally-insulative layer 66 may be compliant in the sense that the compliant thermally-insulative layer 66 is resiliently compressible to absorb vibration, shock, and other mechanical movement of the electronics module 100. The resilient compressibility of the compliant thermally-insulative layer 66 may also urge the electronics module 100 upwardly into thermal contact with the heat sink 86 and/or into thermal contact with a compliant thermal transfer pad 68 that may be mounted between the electronics module upper surface 106 and the heat sink lower surface 90 to improve the drawing of heat out of the electronics module 100 as described in greater detail below.

In an embodiment, the compliant thermally-insulative layer 66 may be formed of material having a relatively high thermal insulative capability. For example, the compliant thermally-insulative layer 66 may be formed of a thermally insulative silicone-based material. In an embodiment, the compliant thermally-insulative layer 66 may be formed from a sheet of silicone rubber or silicone foam having a relatively high insulative capability. The foam may comprise a resiliently compressible silicone-based foam rubber. In this regard, the compliant thermally-insulative layer 66 may be formed of a resiliently compressible foam material and configured such that heat conducting pins 114 of the electronics module 100 shown in FIG. 3 may be maintained in substantially contacting relation with the heat sink lower surface 90 as described in greater detail below.

In FIG. 2, the system 10 may further include a mechanically-resilient or compliant thermal transfer pad 68 configured to substantially conform to the heat sink lower surface 90. The compliant thermal transfer pad 68 may facilitate thermal coupling of the electronics module 100 to the heat sink 86 for conductive heat transfer therebetween. In the embodiment shown, the system 10 may further include a compliant thermally-conductive layer 70 that may be sandwiched between the electronics module upper surface 106 and the compliant thermal transfer pad 68 to provide a direct heat conduction path 82 between the electronics module 100 and the heat sink 86 as described in greater detail below.

The compliant thermal transfer pad 68 may be formed of a material having a relatively high thermal conductivity, relatively low thermal resistance, and relatively high electrical insulative capability. For example, the compliant thermal transfer pad 68 may be formed of a silicone-based material filled with a highly-thermally conductive material such as alumina powder in a silicone matrix as may be commercially available from Laird Technologies, Inc. of St. Louis, Mo., or commercially available from Berquist, Inc. of Chanhassen, Minn. Alternatively, the compliant thermal transfer pad 68 may be formed of graphite sheet sandwiched between thin plastic or electrically-insulative layers or coatings. In an embodiment, the compliant thermal transfer pad 68 may be formed of metal foil (e.g., copper foil) that may be coated with or sandwiched between an electrically-insulating coating such as silicone. Such compliant thermal transfer pad 68 may include adhesive on one or both sides to adhesively bond the compliant thermal transfer pad 68 to the electronics module 100 and/or the heat sink 86. The compliant thermal transfer pad 68 may be coupled to the heat sink lower surface 90 by adhesive bonding such as with a pressure sensitive adhesive.

Alternatively, the compliant thermal transfer pad 68 may be mechanically coupled to the heat sink 86. Advantageously, the compliant thermal transfer pad 68 may improve thermal sinking of the electronics module 100 to draw heat from the electronics module 100 into the heat sink 86.

The system 10 may further include a compliant thermally-conductive layer 70 that may extend between the electronics module lower surface 108 and up along the electronics module side 110 to the heat sink 86 to form a heat conduction path 82 therebetween. For example, in FIG. 2, a horizontal section of the compliant thermally-conductive layer 70 may be sandwiched between the battery 118 and the electronics module lower surface 108 at an electronics board-battery interface 116. A vertical section of the compliant thermally-conductive layer 70 may extend upwardly along a side (e.g., a left-hand side—FIG. 2) of the electronics module 100 within the gap between the electronics module side 110 and the radiation shield 72. A horizontal section of the compliant thermally-conductive layer 70 may be sandwiched between the compliant thermal transfer pad 68 and the electronics module upper surface 106. The compliant thermally-conductive layer 70 may be formed of a material that is highly thermally conductive such that a direct and substantially continuous or uninterrupted heat conduction path 82 is formed from the electronics module lower surface 108 and/or battery 118 up to the heat sink 86.

In a further embodiment, the system 10 may include a compliant thermally-conductive layer 70 having a horizontal section that may be sandwiched between the battery element 120 and the battery board 122 (e.g., circuit board) at a battery element-battery board interface 124. A vertical section of the compliant thermally-conductive layer 70 may extend upwardly along a side (e.g., a right-hand side—FIG. 2) of the electronics module 100. A horizontal section of the compliant thermally-conductive layer 70 may be sandwiched between the compliant thermal transfer pad 68 and the electronics module upper surface 106 to form a direct and substantially continuous heat conduction path 82 from the battery element-battery board interface 124 up to the heat sink 86. The compliant thermally-conductive layer 70 may be adhesively bonded to the compliant thermal transfer pad 68. Alternatively, the compliant thermal transfer pad 68 may be omitted and the compliant thermally-conductive layer 70 may be mounted directly to the heat sink lower surface 90 such as by adhesive bonding or by mechanical attachment or any combination thereof.

Referring to FIG. 3, shown is an alternative embodiment of the system 10 having a plurality of heat conducting pins 114 that may extend generally upwardly from the electronics module upper surface 106. For example, the electronics module 100 may include an electronics circuit board 112 which may contain heat conducting pins 114 extending upwardly from high heat locations on the electronic circuit board or in locations containing heat-sensitive components. The heat conducting pins 114 may extend at least partially into a thickness of the compliant thermal transfer pad 68.

Alternatively, the heat conducting pins 114 may extend substantially completely through the thickness of the compliant thermally-conductive layer 70 and/or through the thickness of the compliant thermal transfer pad 68. In an embodiment, the heat conducting pins 114 may be spring-loaded (not shown) such that the heat conducting pins 114 are maintained in substantially continuous and direct contact with the heat sink lower surface 90 to improve thermal transfer. Advantageously, the resiliently compressible compliant thermally-insulative layer 66 upon which the electronics module 100 may be mounted may provide upward urging of electronics module 100 which may facilitate mechanical contact of the heat conducting pins 114 with the heat sink lower surface 90.

In an alternative embodiment not shown, the system 10 may include a plurality of heat sink extensions (not shown) or protrusions that may extend generally downwardly from the heat sink lower surface 90. Such heat sink extensions may extend through the compliant thermal transfer pad 68 and through the compliant thermally-conductive layer 70 into contact with the electronics module upper surface 106. The heat sink extensions may improve heat conduction from the electronics module 100 into the heat sink 86.

Figure 4:
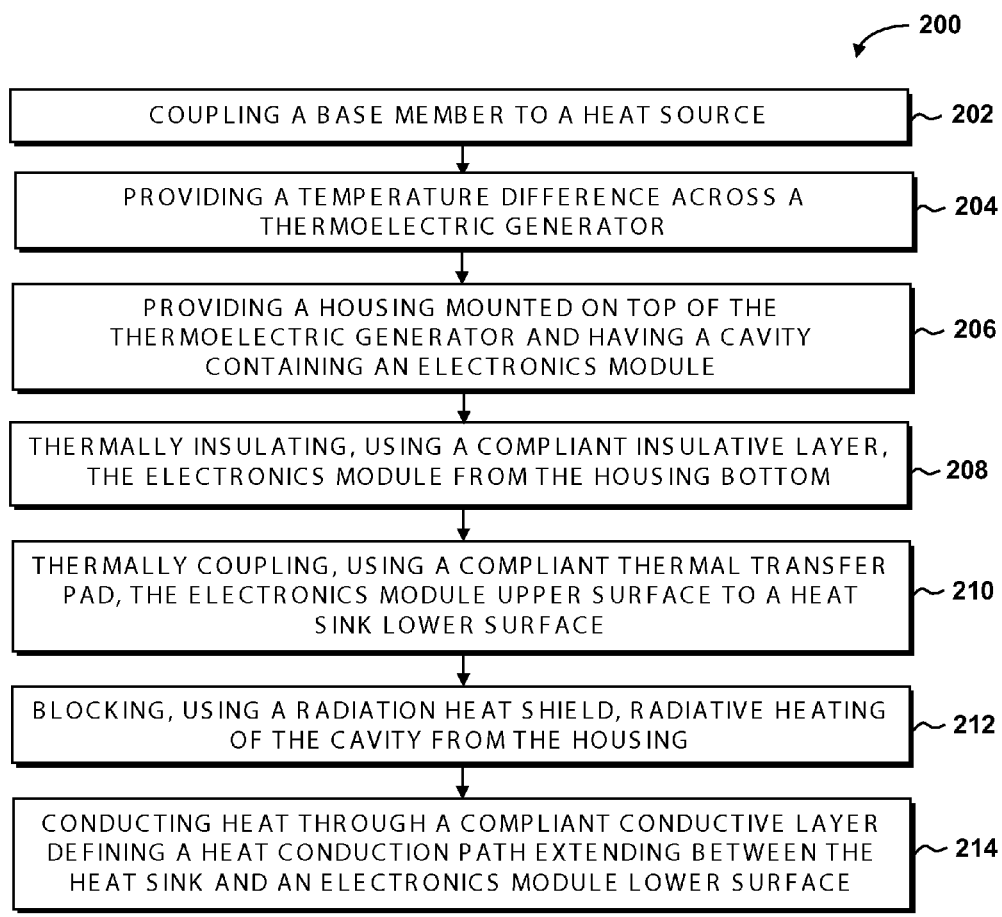
FIG. 4 is a flow diagram having one or more operations that may be included in a method of minimizing the heating of the electronics module of the thermoelectric energy harvesting system.

Referring to FIG. 4, shown is a method 200 that may be implemented for minimizing the heating of the electronics module 100 contained within the thermoelectric energy harvesting system 10. Step 202 of the method may include coupling the base member 36 to the heat source 84 such as by magnetic coupling using a magnet 42 that may be mounted within the base member 36. The base member 36 may be structurally coupled to the housing 50 using a thermal insulating ring 44 as described above.

Step 204 of the method 200 of FIG. 4 may include providing a temperature difference across the thermoelectric generator 24. When the heat source 84 is at a higher temperature than the heat sink 86, heat may flow along a system heat path 94 from the base member 36 across the thermoelectric generator 24 and into the housing 50. The heat may pass into the heat sink 86 whereupon the heat may be the radiated or convectively transferred to the environment by means of cooling elements 92 such as cooling pins or cooling fins protruding from the heat sink 86.

Step 206 of the method 200 of FIG. 4 may include providing the housing 50 with a cavity 52 for mounting the electronics module 100. The cavity 52 may be sized and configured such that the electronics module sides 110 are disposed in non-contacting relation with the housing side wall inner surfaces 56. The housing 50 may be mounted above the thermoelectric generator 24 and in direct thermal and physical contact therewith. The housing 50 may have heat flowing along the system heat path 94 as shown in FIG. 2.

Step 208 of the method 200 of FIG. 4 may include thermally insulating the electronics module 100 from the housing bottom 58 using the compliant thermally-insulative layer 66. As described above, the compliant thermally-insulative layer 66 may be formed of a resiliently compressible material. The resiliently compressible material of the compliant thermally-insulative layer 66 may bias or urge the electronics module upper surface 106 upwardly into thermal contact with the heat sink lower surface 90. For example, the compliant thermally-insulative layer 66 may urge the electronics module upper surface 106 into compressive contact with the compliant thermally-conductive layer 70 and with the compliant thermal transfer pad 68. In this manner, the combination of the compliant thermally-insulative layer 66, compliant thermally-conductive layer 70, and the compliant thermal transfer pad 68 may improve thermal conduction of heat from the electronics module 100 into the heat sink 86.

Step 210 of the method 200 of FIG. 4 may include thermally coupling the electronics module 100 to the heat sink 86 using the compliant thermal transfer pad 68. As described above, the compliant thermal transfer pad 68 may facilitate conduction of heat from the electronics module 100 into the heat sink lower surface 90. In addition, the mechanical compliance of the compliant thermal transfer pad 68 may improve the thermal contact between the heat sink 86 and the compliant thermally-conductive layer 70.

Step 212 of the method 200 of FIG. 4 may include reducing, minimizing, preventing, or eliminating radiative heating 71 of the cavity 52 from the heat within the housing 50 by including a radiation shield 72 along at least a portion of the housing side wall inner surfaces 56. For example, the radiation shield 72 may be applied to a substantial portion of an inner circumference of the housing side wall inner surface 56. In addition, a radiation shield 72 may be applied to the housing bottom upper surface 60 to reduce or retard radiative heating 71 of the cavity 52 from heat in the housing bottom 58.

Step 214 of the method 200 of FIG. 4 may include conducting heat through the compliant thermally-conductive layer(s) 70 extending between the heat sink 86 and the electronics module 100. As described above, the system 10 may include one or more compliant thermally-conductive layers 70 mounted to the electronics module 100 to form one or more direct heat conduction paths 82 to the heat sink 86. For example, heat may be conducted through a compliant thermally-conductive layer 70 to define a direct heat conduction paths 82 between the heat sink 86 and the battery 118.

Advantageously, the radiation shield 72 may limit or minimize the amount of radiative heating 71 of the cavity 52 which may prevent overheating of sensitive electronic components contained within the housing 50. Furthermore, the compliant thermal transfer pad 68 and the compliant thermally-conductive layers 70 may advantageously provide direct heat conduction paths 82 from the electronics module 100 to the heat sink 86 to improve cooling of sensitive electronics. In this regard, the radiation shield 72, the compliant thermal transfer pad 68, and the compliant thermally-conductive layers 70, operating alone or in combination with one another, may advantageously maintain the electronics module 100 below a maximum rated temperature (e.g., 65° C.) of such electronics module 100. In this manner, the system 10 and method disclosed herein may improve the operating efficiency of the thermoelectric generator 24 and electronics module 100. In addition, by maintaining the electronics module 100 below a predetermined temperature or maximum rated temperature, the operating life of the electronics module 100 may be extended.

Shown in FIGS. 5 through 11 are embodiments of the disclosure pertaining to an improved heat flow through a thermoelectric energy harvesting system 10. Because thermoelectric energy harvesters may produce a desirable power output that is proportional to the temperature difference placed across a thermoelectric generator 24, it may be desirable to maximize the flow of available heat through the thermoelectric generator 24 and minimize the bypass or shunting of heat flow around the thermoelectric generator 24. Minimizing the bypass or shunting of heat flow around the thermoelectric generator 24 and minimizing thermal resistances in series with the thermoelectric generator 24 may increase the temperature difference across the thermoelectric generator 24 resulting in an increased power output. Unfortunately, certain aspects of system design may cause less then optimal heat flow through the thermoelectric energy harvesting system 10. For example, thermal connections between various components may provide opportunities for heat to flow around the thermoelectric generator 24 instead of through the thermoelectric generator 24. Additionally, mechanical coupling of a heat source with a heat sink may reduce the available power that may otherwise be generated by the thermoelectric generator 24.

Advantageously, by concentrating the heat flow through the thermoelectric generator 24 and collecting more heat from a heat source and dissipating the heat more effectively at the heat sink, it may be possible to increase power output from a thermoelectric energy harvesting system 10. For example, the temperature difference occurring across the thermoelectric generator 24 may be greater as the thermal resistance is minimized between a heat source and the thermoelectric energy harvesting system 10. In addition, the temperature difference occurring across the thermoelectric generator 24 may also be greater as the thermal resistance is minimized between the thermoelectric generator 24 and the heat sink. Advantageously, the embodiments disclosed herein may improve heat flow through the thermoelectric generator 24, and may provide additional benefits, including, but not limited to, improved hermetic sealing of the thermoelectric generator 24 within the thermoelectric energy harvesting system 10, improved configurations for mounting the thermoelectric energy harvesting system 10 to an external heat source, and immunity of the thermoelectric generator 24 from mechanical stress, in addition to other advantages.

Figure 5:
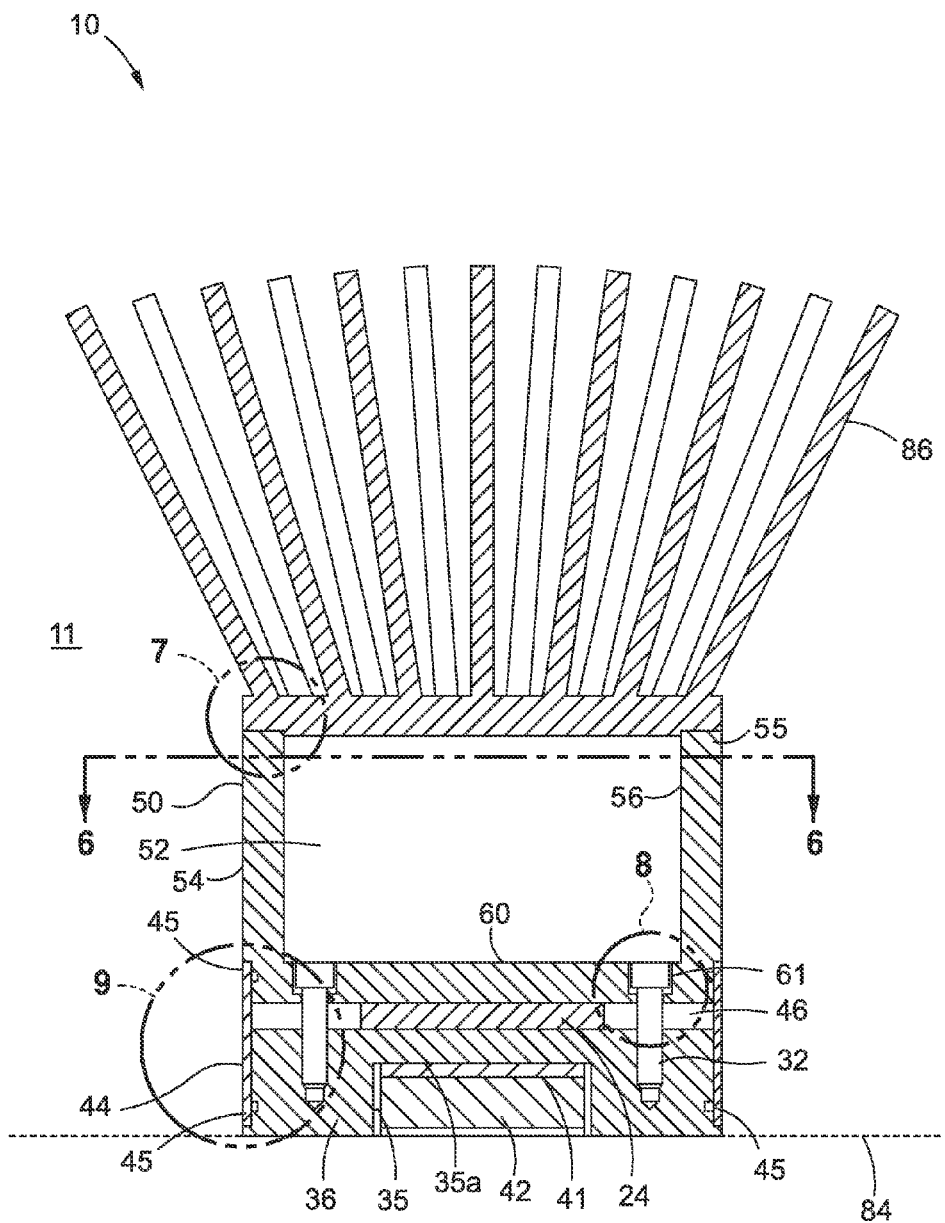
FIG. 5 is a side sectional view of a further embodiment of a thermoelectric energy harvesting system.

Referring to FIG. 5, shown is a side sectional view of an embodiment of a thermoelectric energy harvesting system 10 that may advantageously direct heat flow from heat source 84 through thermoelectric generator 24. The thermoelectric generator 24 may be captured between a base member 36 located below the thermoelectric generator 24 and a housing 50 located above the thermoelectric generator 24. Housing side wall 54 may conduct heat upwards around cavity 52 and into heat sink 86 for dissipating the heat to the external environment 11. Mechanical fasteners 32 may apply suitable contact pressure (e.g. compressive force) upon the thermoelectric generator 24 and may thereby ensure a relatively high thermal conductance between thermoelectric generator 24 and base member 36 and housing 50. Cavity 52 enclosed by housing side wall inner surface 56 and housing bottom upper surface 60 may contain various electronics (not shown) or other components for managing power produced by the thermoelectric energy harvesting system 10. A hollow region 35 may be formed in base member 36 to house mechanical attachment elements, such as magnet 42, or to engage a mechanical boss of an external heat source upon which the thermoelectric energy harvesting system 10 may be mounted. Alternatively, the base member 36 may include threaded bores 37*b* (FIG. 5*a*) into which mechanical fasteners such as screws (not shown) from an external plate (not show) may be threadably engaged as described below. In an embodiment, a magnetically-attracted plate 41 may be inserted between magnet 42 and base member 36 and may serve to close and thereby concentrate magnetic field lines (not shown) and thereby improve the strength of the connection and thereby lower the thermal resistance between the heat source 84 and the base member 36.

Referring still to FIG. 5, insulating ring 44 attaching to circumferences of base member 36 and housing 50 may provide an environmental seal or a hermetic seal for the region of space surrounding thermoelectric generator 24. The insulating ring 44 interconnects the base member 36 to the housing 50. Advantageously, the insulating ring 44 may be comprised of a material having a relatively low thermal conductivity and relatively high mechanical properties such as relatively high strength and stiffness. The relatively low thermal conductivity of the insulating ring 44 may minimize the shunting of heat from the base member 36 through the insulting ring 44 and into the housing 50. The relatively high mechanical properties such as relatively high strength and stiffness and structural stability of the insulting ring 44 may provide mechanical stability of the structural connection between the base member 36 and the housing 50. In addition, the relatively structural stability of the insulting ring 44 may facilitate the ability to machine or form the insulting ring 44 at a relatively high aspect ratio of height to thickness.

In an embodiment, the insulating ring 44 may be comprised of a polymeric material, a fibrous material, and/or a ceramic material having a relatively low thermal conductivity and relatively high mechanical properties. For example, the insulating ring 44 may be comprised of liquid crystal polymer material as a thermally insulating material. Optionally, the insulating ring 44 may be comprised of polyvinyl chloride (PVC) material, polytetrafluoroethylene (Teflon™), or other synthetic materials such as poly-paraphenylene terephthalamide (Kevlar™). However, the insulating ring 44 may be comprised of any material including any metallic material or non-metallic material having a relatively low thermal conductivity and relatively high mechanical properties.

Figure 9:
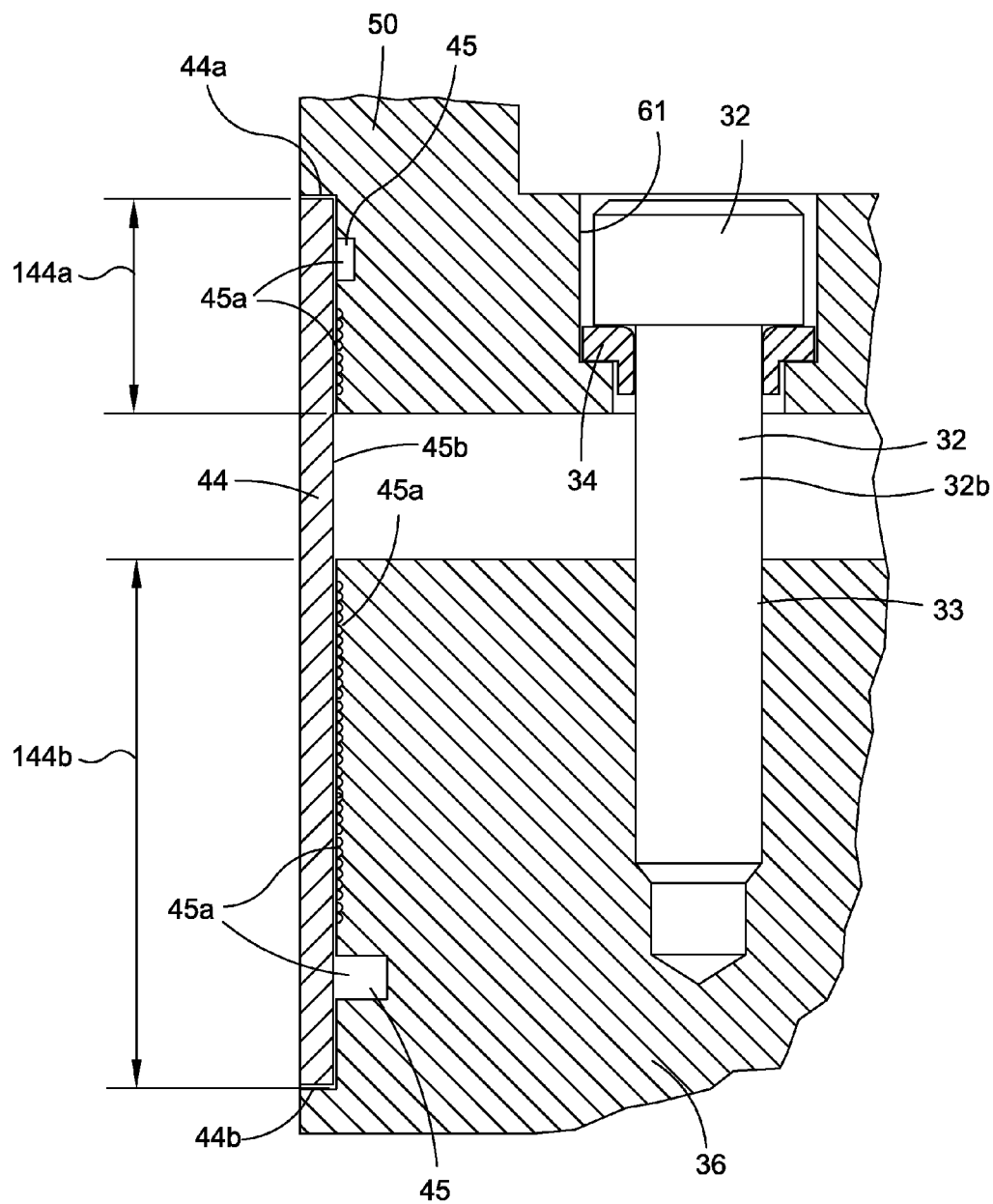
FIG. 9 is a side sectional view of an embodiment of the thermoelectric energy harvesting system having an insulating ring and annular grooves at an interface between the insulating ring and the base member and/or housing.

Advantageously, the material and the configuration (e.g., the geometery such as high aspect ratio and overlap heights) of the insulating ring 44 may ensure that a substantial majority of heat flowing into base member 36 passes through thermoelectric generator 24 and into housing 50. FIG. 9 (discussed below) illustrates one or more annular grooves (not shown) and insulating ring adhesive (not shown) which may promote hermetic sealing of the thermoelectric generator 24, the mechanical stability of the connection between the base member 36 and the housing 50, and improve the total amount of heat flow from the base member 36 through the thermoelectric generator 24 and into the housing 50 relative to the amount of heat flow that may otherwise be shunted around the thermoelectric generator 24.

Figure 8:
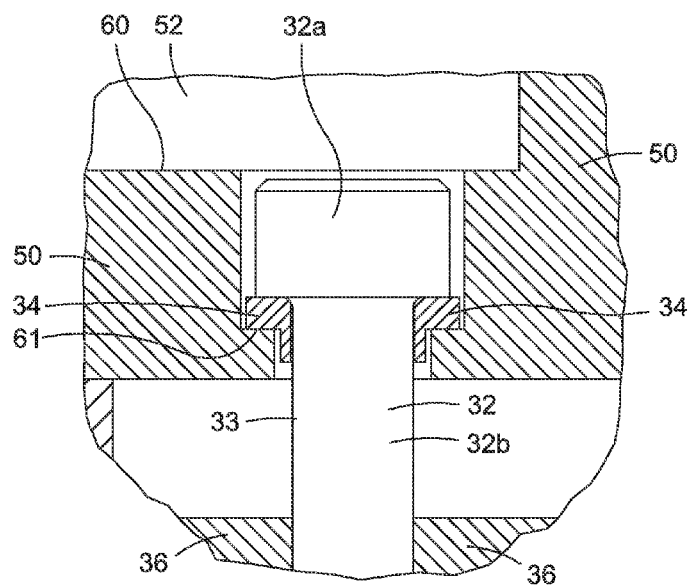
FIG. 8 is a side sectional view of an embodiment of the thermoelectric energy harvesting system having a shoulder spacer installed under a head portion of a mechanical fastener for minimizing heat conduction into the housing.

Referring in more detail to FIGS. 5 and 8, shown are mechanical fasteners 32 interconnecting the base member 36 to the housing 50. As shown in FIG. 8, one or more of the mechanical fasteners 32 may include a head portion 32*a* that may be received within a counterbore 61 (or countersink) that may be formed within a housing bottom upper surface 60 of the cavity 52. A shoulder spacer 34 may be installed within each one of the counterbores 61. The shoulder spacer 34 may advantageously provide a favorable mechanical interface between the head portion 32*a* and the housing 50 and may also minimize thermal contact between the mechanical fastener 32 and the housing 50. Although the shoulder spacer 34 is shown installed within a counterbore 61, the housing 50 may be configured such that the counterbore 61 may be omitted and the shoulder spacer 34 may be installed underneath a head portion 32*a* that may at least partially protrude (not shown) into the cavity 52. Although not shown, it is contemplated that the thermoelectric energy harvesting system 10 may include an arrangement wherein the housing 50 is interconnected to the base member 36 without the use of mechanical fasteners which may eliminate potential heat conduction paths from the base member 36 into the housing 50.

In FIG. 8, the shaft portion 32*b* may extend downwardly through a threaded bore 33 without direct contact of the shaft portion 32*b* with the housing 50 which may advantageously minimize heat flow through shaft portion 32*b* from base member 36 to housing 50. In addition, minimizing heat flow through shaft portion 32*b* from base member 36 to housing 50 may thereby concentrate the heat flow through the thermoelectric generator 24 and thereby improve the power output of the thermoelectric generator 24. As indicated above, the threaded bore 33 may be sized such that the shaft portion 32*b* of the mechanical fastener 32 may pass through the threaded bore 33 without direct contact with the housing 50. In an embodiment, the base member 36 and the housing 50 may be interconnected by three (not shown) or four (shown) mechanical fasteners 32. However, any number of mechanical fasteners 32 may be included to interconnect the base member 36 to the housing 50.

Referring to FIG. 5, the thermoelectric energy harvesting system 10 may include a magnetically-attracted plate 41 located between the magnet 42 and the hollow region upper surface 35a. The magnetically-attracted plate 41 may have the effect of concentrating magnetic field lines of the magnet 42 to increase the magnetic force between a ferrous element or ferromagnetic element within a heat source 84 relative to the magnetic force provided by an arrangement that lacks a magnetically-attracted plate 41. For example, the magnetically-attracted plate 41 may close the magnetic field lines within the diameter of the magnet 42. By closing the magnetic field lines within the diameter of the magnet 42, mechanical attachment may be improved between the base member 36 and the heat source 84 which may lower the thermal resistance between the base member 36 and the heat source 84. In an embodiment, magnetically-attracted plate 41 may be comprised of one or more of the following materials: iron, nickel, cobalt, and other attracting elements. However, magnetically-attracted plate 41 may be comprised of any material or combination of materials, without limitation. Magnetically-attracted plate 41 may be adhesively bonded or mechanically fastened to magnet 42 and/or the base member 36 as described below.

Referring to FIG. 5, the thermoelectric energy harvesting system 10 may include an interference fit between the heat sink 86 and the housing 50. In this regard, the attachment of the heat sink 86 to the housing side wall 54 may provide a lower thermal resistance between housing 50 and heat sink 86 relative to a thermal resistance provided by a non-interference fit. Advantageously, housing upper perimeter edge 55 forms an interference fit with heat sink lower perimeter edge 91 at one or more common boundary surfaces, such as those illustrated in FIGS. 5 and 7 (described below). For example, a round-shaped housing 50 having a single perimeter surface may have one mating boundary on an outside wall with that may be sized and configured to provide an interference fit with a round-shaped heat sink 86 to provide a secure attachment and sealing of the heat sink 86 with the housing 50. In another example, a square-shaped housing 50 may have four (4) mating boundaries of the same geometry that may be sized and configured to provide an interference fit with a square-shaped heat sink 86. Alternatively, 2 or more edges of a perimeter may form mating boundaries in a pinching action, which may establish lower thermal resistance and improved hermetic sealing between the heat sink 86 and the housing 50.

Advantageously, FIG. 5 illustrates an arrangement of the thermoelectric energy harvesting system 10 that provides improved heat flow through the thermoelectric generator 24 by minimizing heat flow through other pathways and components of the thermoelectric energy harvesting system 10 that lie between heat source 84 and the external environment 11. The current disclosure includes embodiments that may increase the available heat flow to the thermoelectric generator 24, and which may advantageously concentrate the available heat flow to occur substantially through the thermoelectric generator 24. FIGS. 5A, 6, 7, 8, 9, 10, and 11 and the below description provide additional detail regarding the advantages disclosed herein.

Figure 5A:
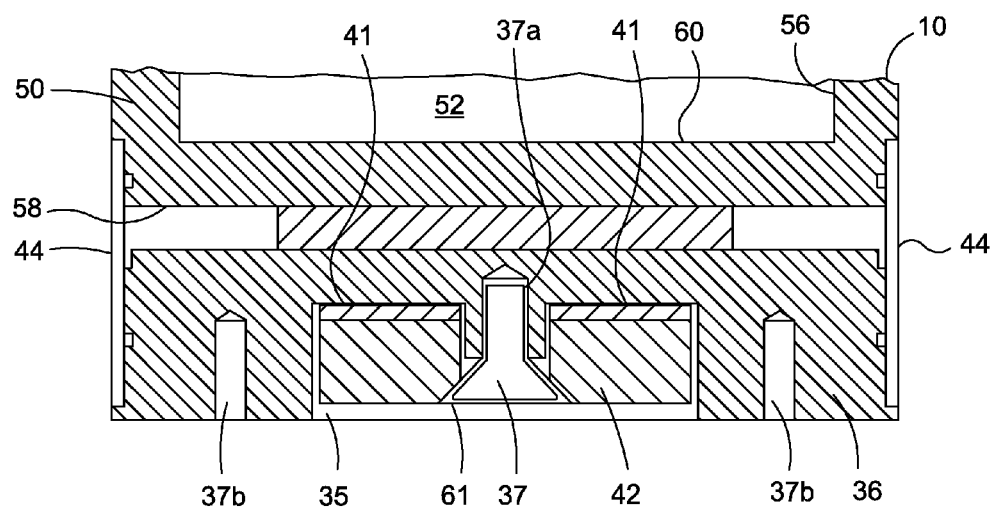
FIG. 5A is a side sectional view of a further embodiment of the thermoelectric energy harvesting system illustrating magnetic means and mechanical means for attaching the thermoelectric energy harvesting system to the heat source.

FIG. 5A is a side sectional view of the lower portion of a thermoelectric energy harvesting system 10, and illustrates an embodiment for mounting the base member 36 to a heat source 84. Shown are insulating ring 44 (described in FIG. 9 below), thermoelectric generator 24 sandwiched between housing 50 and base member 36, and various magnetic and mechanical mounting components within base member 36. The space between insulating ring 44 and thermoelectric generator 24 may constitute an annular gap 46. Not shown are mechanical fasteners 32 (FIGS. 6 and 8 below) that may pass through the annular gap 46 and heat sink 86 (FIG. 7—described below).

In FIG. 5A, heat collected by base member lower surface 40 from heat source 84 may flow upwardly through base member 36 and magnet 42 and into thermoelectric generator 24. Magnet 42 may be enclosed within hollow region 35. Magnetically-attracted plate 41 may be mounted within the hollow region 35 between magnet 42 and hollow region upper surface 35a to improve the mechanical attachment of base member 36 to heat source 84 which may improve heat flow from heat source 84 into base member 36. In comparison to a screw or other mechanical mounting arrangement, a magnetic attachment such as magnet 42 may provide a simplified mounting arrangement and allow quicker removal and installation of a thermoelectric energy harvester such as for repair, inspection, and/or maintenance. For example, the magnet 42 may facilitate mounting the thermoelectric energy harvesting system 10 to a motor casing (not shown), a bearing housing (not shown), a heated pipe (not shown), or any one of a variety of other systems, subsystems, assemblies, or structures that may provide a heat source 84 for the thermoelectric generator 24. Magnetically-attracted plate 41 may be positioned between base member 36 and magnet 42 and may be fastened with one or more mechanical fasteners 37 that may be threadably engaged into threaded bore(s) 37a or adhesively bonded into the hollow region 35. For example, in an embodiment, the magnetically-attracted plate 41 may be placed on top of or coupled (e.g., bonded) to the magnet 42 and the plate 41/magnet 42 may be inserted into the hollow region 35 and mechanically fastened to the base member 36 such as via a mechanical fastener 37 that may be extended upwardly through the plate 41/magnet 42 and into the threaded bore 37a.

In FIG. 5A, although a single, centrally-located mechanical fastener 37 is shown attaching magnet 42 and magnetically-attracted plate 41 to base member 36, any number of mechanical fasteners 37 may be used. In an embodiment, the magnet 42 may include a beveled countersink 61 that may provide for flush mounting of the mechanical fastener 37 within the boundaries of the base member 36 as a means to maintain a flat and unobstructed surface for base member lower surface 40. Alternatively, magnetically-attracted plate 41 may be adhesively bonded to base member 36 and/or to magnet 42. For example, epoxy adhesive may bond magnetically-attracted plate 41 to base member 36 and/or to magnet 42. The plate 41/magnet 42 may be bonded to the hollow region 35.

In FIG. 5A, in an embodiment, heat source 84 may be non-ferromagnetic such that mounting screws (not shown) or other hardware may engage threaded bores 37b that may be formed in the base member 36 to attach base member 36 to heat source 84. Although not shown, the hollow region 35 may be omitted from the base member 36 to provide a solid base member 36 into which threaded bores 37b may be formed for receiving screws (not shown) for attaching base member 36 to heat source 84. It is to be understood that the base member 36 may be provided with a hollow region 35 and magnet 42 may be replaced with a spacer (not shown) formed of non-magnetic material in cases where magnetic attraction is not desired. The non-magnetic material may provide thermal conduction from the heat source 84 into the base member 36. Advantageously, the several mounting variations described herein may accommodate a wide variety of mounting arrangements that may be configured to provide relatively high thermal conduction path and heat flow from the heat source 84 into the base member 36. Additionally, advantages such as quicker installation, lower cost, and greater power output may be provided by the mounting embodiments disclosed herein.

Figure 6:
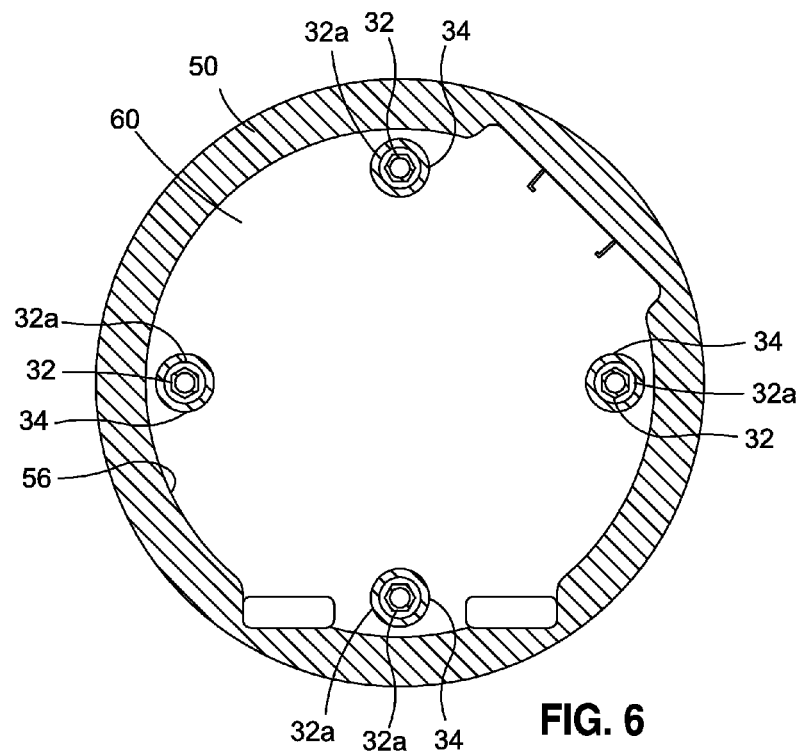
FIG. 6 is a top view of an embodiment of the thermoelectric energy harvesting system illustrating mechanical fasteners for attaching a housing to a base member.
Figure 7:
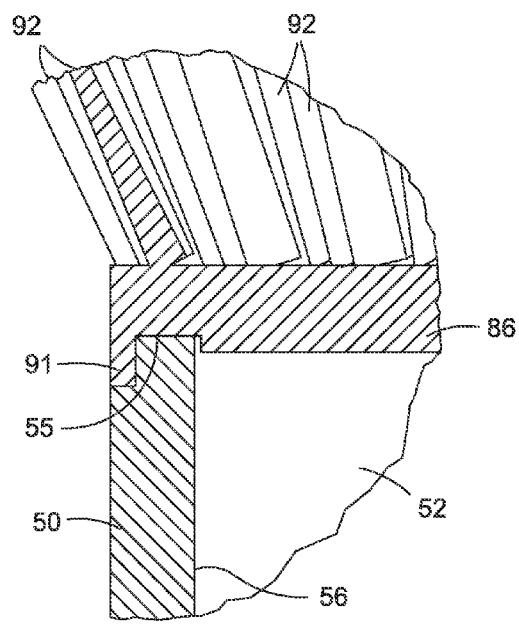
FIG. 7 is a side sectional view of an embodiment of the thermoelectric energy harvesting system having a heat sink joined to the housing with an interference fit.

Referring to FIG. 6, shown is a top sectional view of cavity 52 illustrating the head portion 32a of mechanical fasteners 32 for attaching the housing 50 to the base member 36. As indicated above, one or more of the mechanical fasteners 32 may capture thermoelectric generator 24 between the housing 50 and the base member. Head portion 32a may be installed within counterbore 61 such that head portion 32a is flush-mounted below housing bottom upper surface 60. Thermally insulative shoulder spacer 34 may be installed underneath the head portion 32a to prevent or minimize thermal conduction between mechanical fastener 32 and housing 50. Advantageously, the flush mounting of head portion 32a may provide a flat, unobstructed housing bottom upper surface 60 of cavity 52 for mounting electronics (not shown) or other components. Cavity 52 may be formed by housing side wall inner surface 56 and housing bottom upper surface 60. In an embodiment, mechanical fasteners 32 may be positioned near the housing side wall inner surface 56 in order to minimize the shunting of heat flow though the mechanical fasteners 32. In this manner, a substantial majority of heat flow may advantageously pass through the centrally located thermoelectric generator 24.

FIG. 7 is an enlarged side section view of an upper corner of the housing 50 at a juncture of the heat sink 86 and the housing 50. The housing may include housing upper perimeter edge 55 and which may be sized and configured to mate with or overlap a heat sink lower perimeter edge 91 of the heat sink. The perimeter edges 55, 91 may be sized and configured to provide an interference fit therebetween. For example, the perimeter edges 55, 91 may be sized and configured to provide an interference fit of not more than 0.005 inches (not shown) in the overlap between the housing upper perimeter edge 55 and the heat sink lower perimeter edge 91 at one or more mating surfaces. However, the perimeter edges 55, 91 may be sized and configured to provide an interference fit that is smaller or larger than 0.005 inch. In an embodiment, the inwardly-facing surface of heat sink lower perimeter edge 91 may clasp or engage the outwardly-facing surface of housing upper perimeter edge 55 in an interference fit. In another embodiment (not shown), heat sink 86 may be mounted to housing 50 using a thermally conductive layer (not shown) that provides hermetic sealing of the joint between the housing 50 and the heat sink 86. Advantageously, the disclosed interference fit between one or more mating surfaces of the housing 50 and the heat sink 86 may provide a relatively high thermal conductance therebetween, and may provide a hermetic seal of the cavity 52 from the external environment 11.

Referring to FIG. 8, shown is an enlarged view of a mechanical fastener 32 for interconnecting the housing 50 to the base member 36. As indicated above, a thermally-insulating shoulder spacer 34 may be installed under the head portion 32a of the mechanical fastener 32 to avoid shunting of heat flow from the base member 36 up through the mechanical fasteners 32 and into the housing 50. Advantageously, by minimizing the shunting of heat flow into the housing 50 from the mechanical fasteners 32, heat flow through thermoelectric generator 24 may be maximized. In an embodiment, head portion 32a of mechanical fastener 32 may be received within countersink or counterbore 61. Countersink or counterbore 61 in housing 50 may support shoulder spacer 34 and may thermally isolate housing 50 from mechanical fastener 32. In an embodiment, shaft portion 32b may extend downwardly through threaded bore 33 in base member 36.

Although not shown, the threaded bore 33 in the base member 36 may be sized to limit direct contact between the shaft portion 32b and the base member 36 to an end-most section of the shaft portion 32b such as where the shaft portion 32b threads engage threads in the lower-most portion of the threaded bore 33 formed in the base member 36. In this regard, it is contemplated that the base member may include inserts (not shown) formed of material having relatively low thermal conductivity such as polymeric material or non-metallic material such as the material form which the shoulder spacers may be formed as indicated above or using other material. Each insert may include a threaded bore for threadably receiving the shaft portion 32b of the mechanical fasteners 32 extending downwardly from the housing 50. The base member 36 and housing 50 may be configured such that the shaft portion 32b is disposed in non-contacting relation to the housing 50 and base member 36 except where the shaft portion 32b engages the inserts (not shown).

In an embodiment, shoulder spacer 34 may be formed of a relatively high molecular-weight polymer. In addition, shoulder spacer 34 may be formed of a material having a relatively low thermal conductivity such as a thermal conductivity of less than approximately 1.0 W/(m·K). However, the shoulder spacer 34 may be formed of a material having a thermal conductivity that is greater than 1.0 W/(m·K). In an embodiment, shoulder spacer 34 may be formed of polytetrafluoroethylene (PTFE), also known as Teflon™, commercially available form E. I. du Pont de Nemours, polytetrafluoroethylene (Teflon™), or other synthetic materials such as poly-paraphenylene terephthalamide (Kevlar™). Additionally, shoulder spacer 34 may be formed of other non-metallic material or materials having relatively low thermal conductivity such as ceramics, polymers, fibers, glasses, and other materials. In an embodiment not shown, the mechanical fasteners 32 may be installed such that the head portion is installed in the base member 36 such that the shaft portion 32b may extend upward from base member 36 and threadably engage threaded bores (not shown) formed in housing 50. In such an embodiment, shoulder spacers 34 may be installed underneath the head portions 32a of the base member 36.

Referring to FIG. 9, shown is a side sectional view of a portion of the housing 50 and the base member 36 and illustrating insulating ring 44. Also shown is the mechanical fastener 32 discussed above with regard to FIGS. 5 and 8. The head portion 32a may reside in counterbore or countersink 61 and may be supported by the shoulder spacer 34. The shaft portion 32b is shown extending into the base member 36. A free end of the shaft portion 32b may be threadably engaged to the threaded bore 33.

In FIG. 9, the insulating ring 44 may extend around a circumference of housing 50 and base member 36 to form a hermetic seal and leaving an annular gap 46 region of space around thermoelectric generator 24 (not shown). Thermoelectric generator 24 (not shown) may be sensitive to mechanical stress and yet may require a precise and sufficient coupling pressure provided by mechanical fasteners 32 in order to facilitate the flow of heat from the base member 36 into the thermoelectric generator 24 and from the thermoelectric generator 24 into the housing 50. In that regard, insulating ring 44 may provide a stabilizing mechanical function by promoting uniform compressive loading of the thermoelectric generator 24 by the mechanical fasteners 32 and thereby preventing asymmetric loading of one side of the thermoelectric generator 24. Insulating ring 44 may advantageously be formed of a material having low thermal conductivity to avoid heat conduction through the insulating ring 44 from base member 36 into the housing 50. For example, the insulating ring 44 may be formed of a low thermal conductivity polymeric material or a plastic material. The insulating ring may also be configured to provide reliable hermetic sealing for the thermoelectric generator 24 housed within the annular gap 46.

Toward the ends indicated above, the insulating ring 44 may extend from ring upper edge 44a to ring lower edge 44b. The ring upper edge 44a may mate to a circumference of housing 50. The ring lower edge 44b may attach to base member 36 along ring inner circumferential surface 45b. The insulating ring 44 may be formed with a relatively high aspect ratio defined as a ratio of the thickness of the insulating ring 44 to the overall height of the insulating ring 44. Advantageously, a relatively high aspect ratio of the insulating ring 44 may minimize heat flow from base member 36 to the housing 50.

In FIG. 9, the interface between the insulating ring 44 and the base member 36 and/or housing 50 may include one or more annular grooves 45. For example, one or more annular grooves 45 may be formed in at least one of the housing 50 and the base member 36. In the embodiment shown, the annular grooves 45 may face the ring inner circumferential surface 45b. An insulating ring adhesive 45a such as an epoxy adhesive, a room-temperature vulcanizing (RTV) adhesive, a cyanoacrylate adhesive, or other adhesive may at least partially fill the annular grooves 45. In addition, insulating ring adhesive 45a may be installed between along the ring inner circumferential surface 45b and the base member 36 and/or housing 50. The insulating ring adhesive 45a may adhesively bond the insulating ring 44 to the circumference of the housing 50 and the base member 36. In an embodiment, the insulating ring adhesive 45a may be an epoxy adhesive having a relatively low thermal conductivity.

Advantageously, the annular grooves 45 and the insulating ring adhesive 45a may provide improved hermetic sealing for the thermoelectric generator 24 within the annular gap 46. In an embodiment, the insulating ring 44 may be formed of a liquid crystal polymer material or other polymeric material, ceramic material, etc., having low thermal conductivity. In an embodiment, the insulating ring 44 may be formed of glass-filled liquid crystal polymer having a relatively low thermal conductivity and/or relatively high strength and relatively high structural stability. The relatively high structural stability may allow for forming the insulating ring 44 at a high height to thickness aspect ratio which may reduce thermal flow through the insulating ring 44. Advantageously, the combination of the relatively high aspect ratio and low thermal conductivity of the insulating ring 44, the annular grooves 45 formed in the base member 36 and/or the housing 50, and the insulating ring adhesive 45a, may thermally isolate and hermetic seal the thermoelectric generator 24 and mechanically stabilize the connection between the base member 36 and the housing 50.

Referring still to FIG. 9, insulating ring 44 may overlap the housing 50 by an overlapping height 144a and may overlap the base member 36 by an overlapping height 144b. In an embodiment, ring upper edge 44a may be sized and configured to overlap the housing 50 at an overlapping height 144a that is less than the overlapping height 144b of ring lower edge 44b with the base member 36. By providing the overlapping height 144a to be less than the overlapping height 144b, heat flow from the base member 36 through the insulating ring 44 and into the housing may be minimized. In an embodiment, overlapping height 144b may be greater than overlapping height 144a by no less than a ratio of approximately 2:1, However, the overlapping height 144b may be greater than overlapping height 144a by a ratio that is less than or greater than a ratio of 2:1. In consideration of the operating temperatures of base member 36 and housing 50, as well as the sensitivity of and mechanical pressure upon thermoelectric generator 24, the above-mentioned materials, relative geometries, and dimensions associated with the insulating ring 44 may provide an arrangement that promotes heat flow primarily through the thermoelectric generator 24. In addition, the materials, relative geometries, and dimensions associated with the insulating ring 44 may provide hermetic sealing of the thermoelectric generator 24 within the thermoelectric energy harvesting system 10. For example, by configuring the insulating ring 44 with an overlapping height 144a that is maximized on the base member 36 (e.g., hot side), a thermal insulating effect may be provided for the base member 36 wherein radiative and convective cooling of the base member 36 may be minimized which may result in an increase in heat flow through the thermoelectric generator 24. Conversely, by minimizing the overlapping height 144a on the housing 50 (e.g., cold side), convective and radiative cooling may be promoted which may result in an increase in the heat flow through the thermoelectric generator 24.

Figure 10:
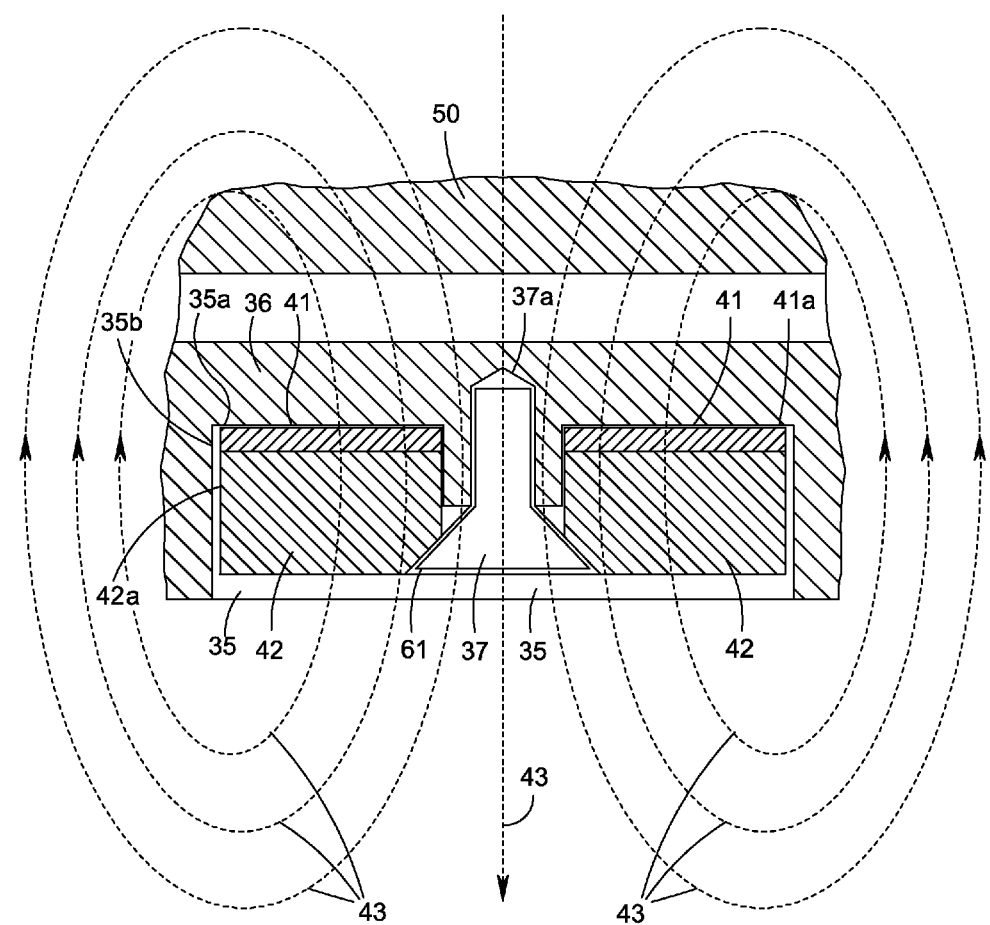
FIG. 10 is a side sectional view of an embodiment of the thermoelectric energy harvesting system having a magnet and a magnetically-attracted plate for closing magnetic field lines of the magnet.

Referring to FIG. 10, shown is a side sectional view of a lower portion of the thermoelectric energy harvesting system 10 and illustrating the magnetically-attracting plate 411 installed between the magnet 42 and the base member 36. Advantageously, the magnetically-attracting plate 41 may close and concentrate magnetic field lines 43 of the magnet 42 which may generally have a torus shape. When viewed from the side as shown in FIG. 10, the magnetic field lines 43 may appear as two symmetrical ellipses that are elongated in a vertical axis (not shown). Concentration of magnetic field lines 43 by the magnetically-attracting plate 41 may advantageously result in a relatively narrow ellipse shape of the magnetic field lines 43 along a horizontal axis relative to the shape of magnetic field lines generated by an arrangement that lacks a magnetically-attracting plate 41. In this regard, the magnetically-attracting plate 41 may provide a secure attachment base member 36 to a heat source 84, and may also thereby increase thermal conductance. Magnetically-attracted plate 41 may have a plate perimeter 41a that is sized complementary to a magnet perimeter 42a. However, magnetically-attracted plate 41 may be provided in any size, shape, and configuration, without limitation.

In FIG. 10, the combination of the magnet 42 and the magnetically-attracted plate 41 may provide a simplified mounting arrangement for mounting the thermoelectric energy harvesting system 10 to a heat source 84. In addition, the combination of the magnet 42 and the magnetically-attracted plate 41 may allow for relatively rapid installation and removal of the thermoelectric energy harvesting system 10 from a heat source 84 to facilitate inspection, repair and/or maintenance of the thermoelectric energy harvesting system 10. As indicated above, magnetically-attracted plate 41 may be positioned between base member 36 and magnet 42 and fastened with one or more mechanical fasteners 37 extending into threaded bore(s) 37a. Alternatively, magnetically-attracted plate 41 may be adhesively bonded to the base member 36 such as with an, epoxy adhesive. In a further embodiment, the magnetically-attracted plate 41 and/or the magnet 42 may be mechanically fitted into the hollow region 35.

For example, the magnetically-attracted plate 41 may be press fit into the hollow region 35 or the magnetically-attracted plate 41 may include surface features (not shown) such as small protrusions or cleats on an outer perimeter of the magnetically-attracted plate 41 to mechanically bind the magnetically-attracted plate 41 to the hollow region perimeter surface 35b. Once the magnetically-attracted plate 41 is inserted into the hollow region 35, the magnet 42 may be installed and may magnetically attach to the magnetically-attracted plate 41 via magnetic force such that no further attachment is necessary. In applications where the heat source 84 is formed of non-ferromagnetic material such as an aluminum or ceramic material, a separate magnet (not shown) may be mounted to a strap (not shown) or other mechanism that may be separately attached to the non-ferromagnetic heat source 84. The separate magnet may have a size and shape that is complementary to the size and shape of the hollow region 35 such that the thermoelectric energy harvesting system 10 may be installed inserting the hollow region of the base member 36 over the separate magnet that is strapped to the heat source 84. It may also be appreciated that magnet 42 may be replaced with a spacer (not shown) formed of non-magnetic material suitable for mechanically attaching the thermoelectric energy harvesting system 10 to a heat source 84. As indicated above, threaded bores 37b may be formed in the base member 36 for receiving a screw extending upwardly from heat source 84.

Figure 10A:
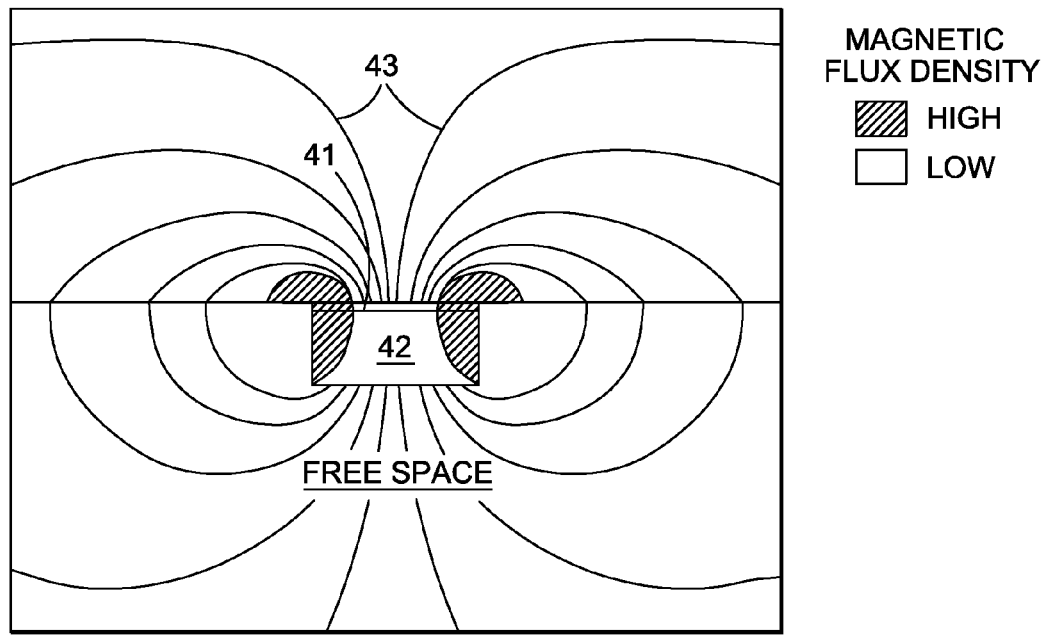
FIG. 10A is a computer simulation illustrating magnetic flux lines generated by a magnet with magnetically-attracted plate coupled thereto and wherein the magnet/plate are in free space.
Figure 10B:
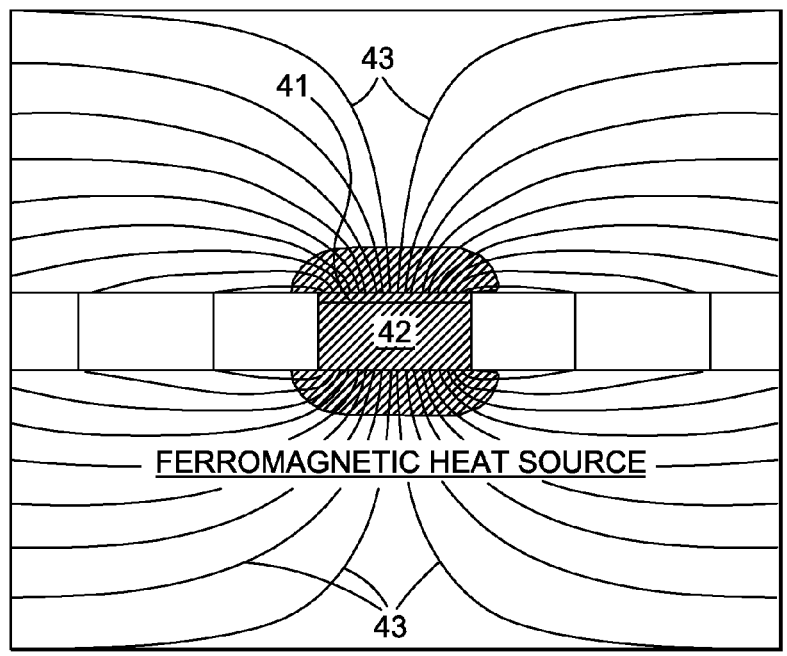
FIG. 10B is a computer simulation illustrating magnetic flux lines generated by the magnet/plate coupled to a ferromagnetic heat source.

Referring to FIGS. 10-10B, shown are computer simulations of the magnetic field line 43 generated by the magnet 42 with the magnetically-attracted plate 41. FIG. 10A illustrates the magnetic field lines 43 and relative magnetic flux density generated by the combination magnet 42/plate 41 in free space. As can be seen in FIG. 10A, the magnetic field lines 43 are generally non-symmetric about a horizontal reference line passing through the magnetically-attracted plate 41. Also shown is a relatively small region of high magnetic flux density around the edges of the combination magnet 42/plate 41 in free space. FIG. 10B illustrates the magnetic field lines 43 and relative magnetic flux density generated by the combination magnet 42/plate 41 when attached to a ferromagnetic heat source 84. As can be seen in FIG. 10B, the magnetic field lines 43 are symmetric about the horizontal reference line passing through the magnetically-attracted plate 41. In addition, the region of high magnetic flux density around the combination magnet 42/plate 41 is significantly larger in FIG. 10B relative to the relatively small size of the region of high magnetic flux density in FIG. 10A illustrating the increased magnetic attraction achieved by including the magnetically-attracted plate 41 with the magnet 42.

Figure 10C:
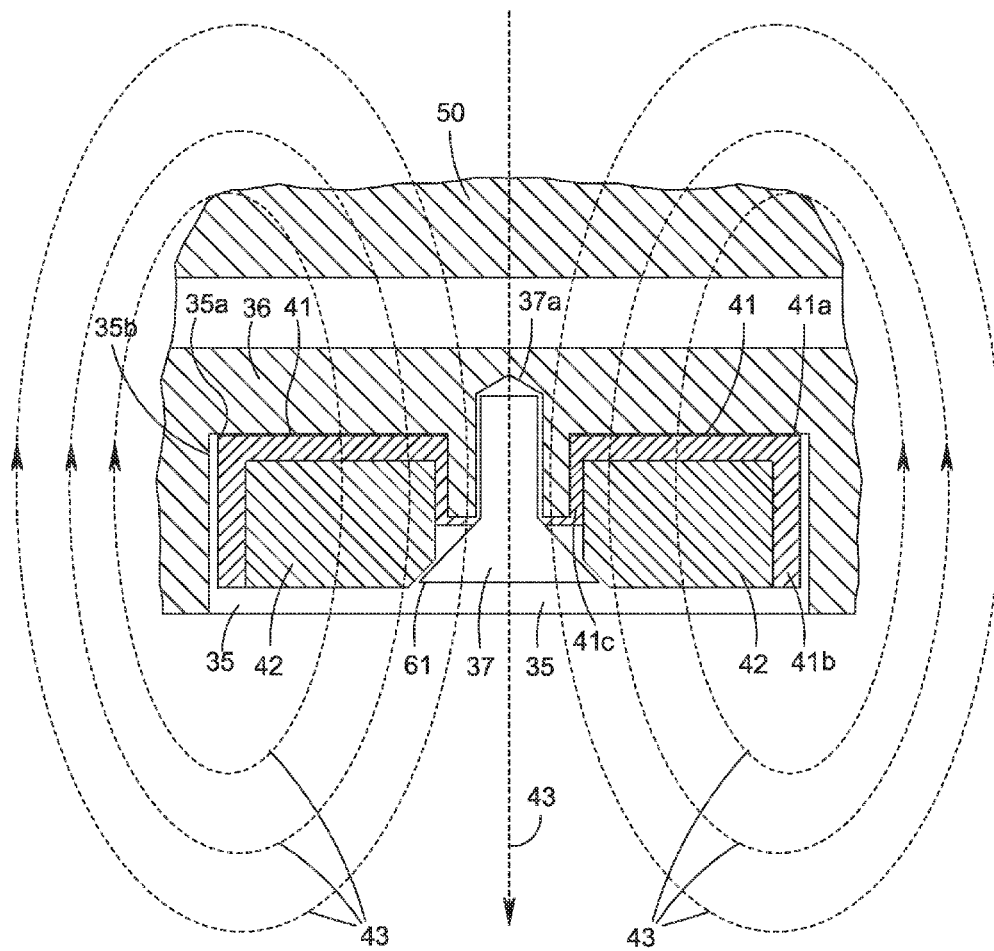
FIG. 10C is a side section view of an embodiment of the thermoelectric energy harvesting system having a magnetically-attracted plate with a U-shaped cross-section.

Referring to FIG. 10C, shown is an embodiment of the thermoelectric energy harvesting system 10 wherein the magnetically-attracted plate 41 has an annular inverted U-shaped cross-section. The magnetically-attracted plate 41 includes an annular outer flange 41b extending around the plate perimeter, and an annular inner flange 41c extending around the mechanical fastener 37. Advantageously, the inverted U-shaped cross-section of the magnetically-attracted plate 41 in FIG. 10C may provide a greater magnetic attraction force between the combination magnet 42/plate 41 and a ferromagnetic heat source 84. Although not shown, the U-shaped cross-section of the magnetically-attracted plate 41 may cause the magnetic field lines 43 to shorten and more easily close when mounted to a ferromagnetic heat source 84 and generating a stronger magnetic attraction to the ferromagnetic heat source 84.

Figure 11:
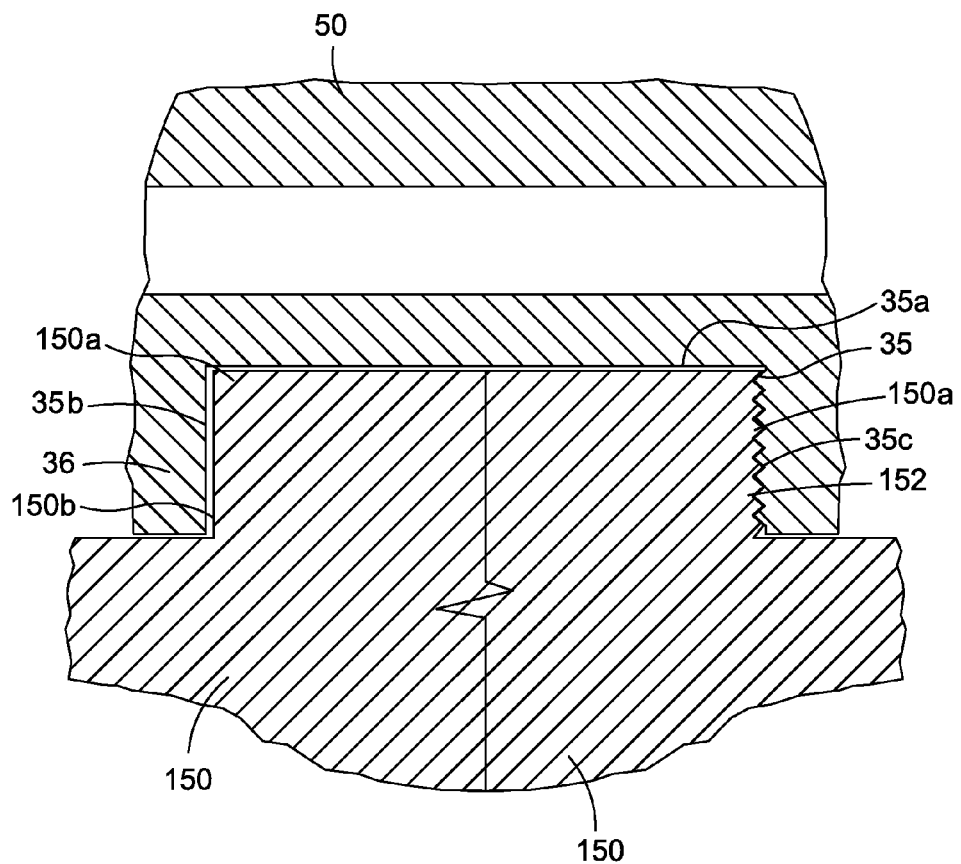
FIG. 11 is a side sectional view of a further embodiment of a thermoelectric energy harvesting system having a slip-fit embodiment and a threaded embodiment for attaching the thermoelectric energy harvesting system to an external heat source.

FIG. 11 is a side sectional view of an alternative embodiment of a lower portion of the base member 36. The base member 36 may include the hollow region 35 formed in an underside thereof and including a hollow region perimeter surface 35b. Illustrated on a left-hand side of the hollow region 35, the hollow region perimeter surface 35b may be sized and configured to slidably receive a boss perimeter surface 150b of the boss 150a of an external heat source 150. The boss 150a of external heat source 150 may slip fit or slidably fit into the hollow region perimeter surface 35b. For example, the hollow region perimeter surface 35b may be sized and configured to provide a slight interference fit (e.g., 0.001 inch or less) with the boss 150a of the external heat source 150. A slight interference fit may promote improved thermal conductance between the hollow region perimeter surface 35b and the boss 150a of the external heat source 150. In addition, a slight interference fit may promote mechanical stability of the attachment of the thermoelectric energy harvesting system 10 to the heat source 84. Furthermore, a slight interference fit between the hollow region perimeter surface 35b and the boss 150a of the external heat source 150 may reduce complexity of the attachment of the thermoelectric energy harvesting system 10 to the heat source 84.

Referring to FIG. 11, illustrated on a right-hand side of the hollow region 35, the hollow region perimeter surface 35b may be provided with internal threads 35c to threadably engage external boss threads 152 formed on the boss 150a of the external heat source 150. In such an arrangement, the base member 36 of the thermoelectric energy harvesting system 10 may be twisted or screwed onto the external heat source 150 which may facilitate rapid removal and installation of the thermoelectric energy harvesting system 10 onto a heat source 84.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A thermoelectric energy harvesting system, comprising:
   a thermoelectric generator configured to produce a voltage in response to a temperature difference across the thermoelectric generator;
   a housing mounted on top of the thermoelectric generator and including a housing side wall and a housing bottom having a housing bottom lower surface, the housing defining a cavity, the cavity containing an electronics module, the cavity and the electronics module being located above and physically separated from the thermoelectric generator by the housing bottom;
   a base member having a base member upper surface, the base member positioned under the housing in a manner such that the thermoelectric generator is captured between the base member upper surface and the housing bottom lower surface;
   an insulating ring mounted to an outer circumference of the housing and an outer circumference of the base member and enclosing an annular gap having upper and lower sides respectively defined by the housing bottom lower surface and the base member upper surface, the annular gap having inner and outer circumferential sides respectively defined by sides of the thermoelectric generator and the insulating ring;
   and
   an insulating ring adhesive adhesively bonding the insulating ring to the outer circumference of the housing and the outer circumference of the base member.

2. The system of claim 1, wherein:
   the insulating ring is formed of at least one of the following materials: polymeric material, ceramic material, or fibrous material.

3. The system of claim 1, wherein:
   the insulating ring is formed of at least one of polyvinyl chloride and polytetrafluoroethylene.

4. The system of claim 1, wherein:
the insulating ring comprises a ring upper edge and a ring lower edge disposed in overlapping relation to the outer circumference of the housing and the outer circumference of the base member; and
the ring upper edge is sized to overlap the the outer circumference of the housing at an overlapping height that is less than an overlapping height of the ring lower edge and the outer circumference of the the base member.

5. The system of claim 1, further comprising:
a heat sink mounted on top of the housing and including a heat sink lower surface having a heat sink lower perimeter edge,
the housing side wall having a housing upper perimeter edge; and
the heat sink lower perimeter edge and the housing upper perimeter edge being disposed in overlapping relation forming an interference fit therebetween.

\* \* \* \* \*